United States Patent
Tachikawa et al.

(10) Patent No.: US 7,640,142 B2
(45) Date of Patent: Dec. 29, 2009

(54) POSITION MEASUREMENT APPARATUS AND METHOD AND PATTERN FORMING APPARATUS AND WRITING METHOD

(75) Inventors: Yuichi Tachikawa, Shizuoka (JP); Kazumichi Yasui, Shizuoka (JP); Kiyoshi Nakaso, Shizuoka (JP); Kiyoshi Hattori, Tokyo (JP); Tsugiyuki Okuya, Hiroshima (JP); Makoto Mita, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 532 days.

(21) Appl. No.: 11/492,843

(22) Filed: Jul. 26, 2006

(65) Prior Publication Data

US 2007/0024864 A1  Feb. 1, 2007

(30) Foreign Application Priority Data

Jul. 28, 2005 (JP) ............................. 2005-218226
Jul. 28, 2005 (JP) ............................. 2005-218227

(51) Int. Cl.
*H04B 15/00* (2006.01)
(52) U.S. Cl. ..................... 702/197; 702/95; 702/195
(58) Field of Classification Search ............. 702/195, 702/197
See application file for complete search history.

(56) References Cited

U.S. PATENT DOCUMENTS

| | | | |
|---|---|---|---|
| 4,730,928 A | 3/1988 | Gabriel et al. | |
| 6,034,378 A | 3/2000 | Shiraishi | |
| 6,118,516 A | 9/2000 | Irie et al. | |
| 7,145,924 B2 * | 12/2006 | Tojo et al. | 372/21 |
| 2003/0062479 A1 * | 4/2003 | Kametani et al. | 250/310 |

FOREIGN PATENT DOCUMENTS

| | | |
|---|---|---|
| JP | 3-152770 | 6/1991 |
| JP | 6-291021 | 10/1994 |
| JP | 6-349707 | 12/1994 |
| JP | 8-285538 | 11/1996 |
| JP | 10-153410 | 6/1998 |
| JP | 2000-058424 | 2/2000 |
| JP | 2002-17328 | 1/2002 |
| JP | 2002-131015 | 5/2002 |
| JP | 2004-171333 | 6/2004 |
| TW | 591201 | 6/2004 |
| TW | 200417094 | 9/2004 |
| TW | M248111 | 10/2004 |

\* cited by examiner

*Primary Examiner*—Bryan Bui
*Assistant Examiner*—Jonathan Teixeira Moffat
(74) *Attorney, Agent, or Firm*—Oblon, Spivak, McClelland, Maier & Neustadt, L.L.P.

(57) ABSTRACT

A position measurement apparatus includes a movable stage structure, a measurement unit using a laser to measure a moved position of the stage and to output a corresponding measured value, a first filter configured to attenuate a first component of a certain frequency region of the measured value outputted by the measurement unit, a second filter connected in parallel with the first filter configured to attenuate a second component other than the certain frequency region of the measured value outputted by the measurement unit, a third filter connected in series to the second filter with the series connection of the second and third filters connected in parallel with the first filter, configured to attenuate the first component of the certain frequency region of the measured value outputted by the measurement unit, and a processing unit configured to combine an output of the first filter and an output of the series connection of the second and third filters and to thereby output a first combined value.

19 Claims, 37 Drawing Sheets

Frequency Needed for Stage Position Measurement

Frequency Needed for Stage Position Measurement $$G(S) = \frac{1}{1+\tau_1 \cdot S} + \left( \frac{\tau_2 \cdot S}{1+\tau_2 \cdot S} \times \frac{1}{1+\tau_3 \cdot S} \right)$$

$$\left( \text{where } \tau_n = \frac{1}{2\pi f_n} \right)$$

| $f_1 = f_2 = f_3$ | f | 100Hz | 6.3kHz |
|---|---|---|---|
| 5kHz | Gain | 0dB | 0.4dB |
| | Phase | 0deg | -35deg |
| 3kHz | Gain | 0dB | -1.9dB |
| | Phase | 0deg | -52deg |
| 1kHz | Gain | 0.08dB(0.9%) | -10dB(32%) |
| | Phase | 0.1deg | -76deg |

FIG. 10

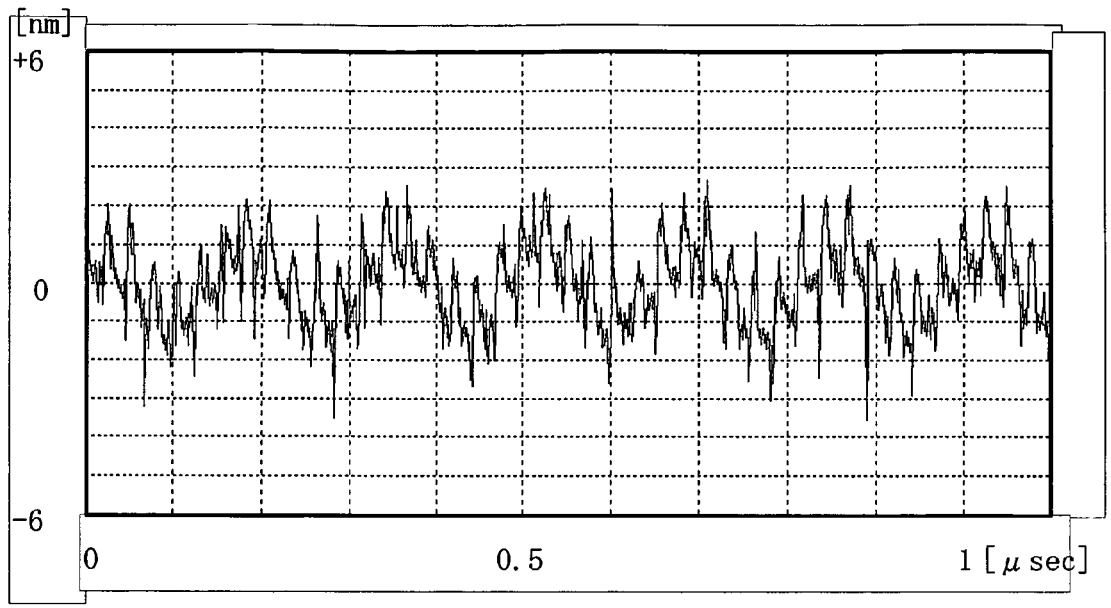
FIG. 11A  Filter OFF
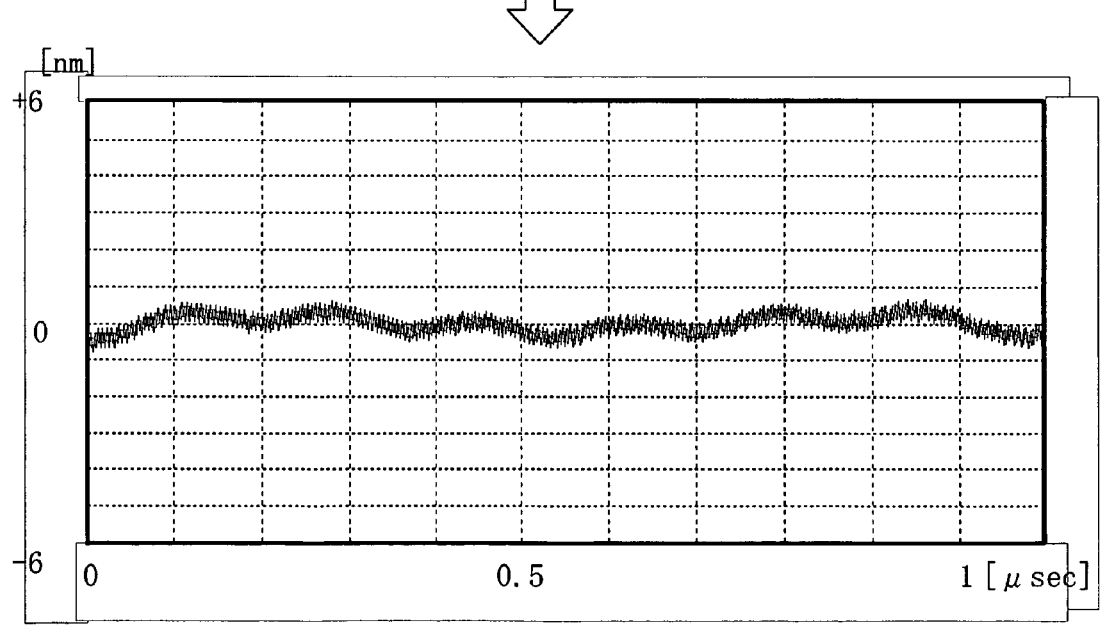
FIG. 11B  Filter ON $$G_1(S) = \frac{1}{1+\tau \cdot S}$$

$$1 - G_1(S) = 1 - \frac{1}{1+\tau \cdot S} = \frac{\tau \cdot S}{1+\tau \cdot S}$$

Residual Difference of Velocity Term $$\frac{1}{1+\tau s}$$
Simple LPF $$G_2(S) = \frac{1}{1+\tau \cdot S}\left[1+\frac{\tau \cdot S}{1+\tau \cdot S}\right]$$

$$= 1 - \frac{\tau^2 \cdot S^2}{(1+\tau \cdot S)^2}$$

FIG. 21A $$1 - G_2(S) = 1 - \left[1 - \frac{\tau^2 \cdot S^2}{(1+\tau \cdot S)^2}\right]$$

$$= \underbrace{\frac{\tau^2 \cdot S^2}{(1+\tau \cdot S)^2}}_{\text{Residual Difference of Acceleration Term}}$$

FIG. 21B $$\frac{1}{1+\tau s}\left(1+\frac{\tau s}{1+\tau s}\right)$$

Velocity Correction-Added LPF $$G_3(S) = \frac{1}{1+\tau \cdot S} \left[ 1 + \frac{\tau \cdot S}{1+\tau \cdot S} \left[ 1 + \frac{\tau \cdot S}{1+\tau \cdot S} \right] \right]$$

$$= 1 - \frac{\tau^3 \cdot S^3}{(1+\tau \cdot S)^3}$$

FIG. 24A $$1 - G_3(S) = 1 - \left[ 1 - \frac{\tau^3 \cdot S^3}{(1+\tau \cdot S)^3} \right]$$

$$= \frac{\tau^3 \cdot S^3}{(1+\tau \cdot S)^3}$$

Residual Difference of Variable Acceleration Term

FIG. 24B $$\frac{1}{1+\tau s}\left[1+\frac{\tau s}{1+\tau s}\left(1+\frac{\tau s}{1+\tau s}\right)\right]$$

Acceleration-Correcting LPF

Simple LPF $$\frac{1}{1+\tau s}$$

Velocity Correction LPF $$\frac{1}{1+\tau s}\left(1+\frac{\tau s}{1+\tau s}\right)$$

Acceleration Correction LPF $$\frac{1}{1+\tau s}\left[1+\frac{\tau s}{1+\tau s}\left(1+\frac{\tau s}{1+\tau s}\right)\right]$$

Acceleration Correction LPF $$\frac{1}{1+\tau s}\left[1+\frac{\tau s}{1+\tau s}\left(1+\frac{\tau s}{1+\tau s}\right)\right]$$

$$G_4(S) = \frac{1}{1+\tau \cdot S}\left[1+\frac{\tau \cdot S}{1+\tau \cdot S}\left[1+\frac{\tau \cdot S}{1+\tau \cdot S}\left[1+\frac{\tau \cdot S}{1+\tau \cdot S}\right]\right]\right]$$

$$= 1 - \frac{\tau^4 \cdot S^4}{(1+\tau \cdot S)^4}$$

$1 - G_4(S) = 1 - \left[1 - \frac{\tau^4 \cdot S^4}{(1+\tau \cdot S)^4}\right]$ $$= \frac{\tau^4 \cdot S^4}{(1+\tau \cdot S)^4}$$

Residual Difference of High-Order Acceleration Term

Variable Acceleration-Correcting LPF $$\frac{1}{1+\tau s}\left\{1+\frac{\tau s}{1+\tau s}\left[1+\frac{\tau s}{1+\tau s}\left(1+\frac{\tau s}{1+\tau s}\right)\right]\right\}$$

POSITION MEASUREMENT APPARATUS AND METHOD AND PATTERN FORMING APPARATUS AND WRITING METHOD

CROSS-REFERENCE TO RELATED APPLICATIONS

Priority is claimed to Japanese Patent Application No. JP 2005-218226 and to Japanese Patent Application No. JP 2005-218227, both filed Jul. 28, 2005, the disclosures of which are incorporated herein by reference.

FIELD OF THE INVENTION

The present invention relates generally to position measurement technologies and writing technologies and, more particularly, to a technique for optically measuring and detecting a present position of a moving stage structure.

DESCRIPTION OF RELATED ART

In recent years, highly integrated semiconductor devices require more and more decreased feature size in on-chip patterns with an increase in integration density of large-scale integrated (LSI) circuits. To form a desired circuit pattern on such semiconductor devices, a microlithographic exposure apparatus is used. A prior known approach to doing this is to employ a process having the steps of placing a chosen one of masks (e.g., reticles or photomasks) with many kinds of original or "master" image patterns being formed thereon, mounting on a stage structure a workpiece such as a semiconductor wafer having its exposure surface area, performing highly accurate position alignment of the master pattern relative to the wafer exposure area, and driving a light source to emit a beam of laser light, which falls onto the wafer so that the mask circuit pattern is transferred onto the exposure area of the target wafer. An example of such apparatus is a reduced image projecting exposure tool. The master pattern is imaged and formed on a fine-finished glass plate by resist processes and others. Usually a glass substrate is prepared which has its one-side surface with a thin film of chromium (Cr) being vapor-deposited. Then, a film of photoresist material is uniformly deposited on the substrate. An energy particle beam, such as electron beam or laser beam, is used to perform the photo/electron beam-sensitization of the resist material at selected surface portions thereof. After completion of known development, the Cr film is selectively etched to thereby form or "write" the pattern.

Traditionally, optical lithography of the type scanning a laser beam has been used in the manufacture of semiconductor devices. In recent years, as the semiconductor devices further decrease in minimum feature size and increase in integration density, electron lithography is employed to form or "write" extra-fine circuit patterns of ultralarge-scale integration (ULSI).

See FIG. 38, which shows some major components of a prior known variable-shaped electron beam exposure apparatus for explanation of an operation thereof. As shown herein, this EB exposure tool includes a couple of spaced-apart aperture plates 410 and 420. The upper aperture 410 has a rectangular opening 411, which shapes an electron beam leaving a charge particle source 430 and then falling onto aperture 410. The lower aperture 420 has a variable shaping opening 421 for shaping the electron beam 330 that has passed through the upper aperture opening 411 into a desired rectangular cross-section. After penetration of the aperture opening 411, the electron beam 330 is deflected by a deflector to pass through part of the lower aperture opening 421, resulting in irradiation onto a target workpiece which 340 is placed on a stage that is movable in a one direction, e.g., X-axis direction. In short, only a specific pattern with a rectangular cross-section capable of passing through both aperture openings 411 and 420 is irradiated or "shot" onto the workpiece surface so that an image of the intended pattern is formed in the aimed exposure region of workpiece 340 on the stage moving along the X direction. This approach to forming a desired shape by letting the beam penetrate both the aperture holes 411 and 421 is called the "variable shaping," as disclosed, for example, in JP-A-2000-58424.

In both the laser beam scanning optical lithography systems and the electron beam exposure systems, high-accuracy position alignment of a stage structure is required. Typically the stage is driven by an actuator, and its moved position is measured by a laser-assisted distance measurement device using a laser interferometer to generate a stage position measurement data signal. This position data signal can often contain therein nonlinear error components or "noises." These noises affect the accuracy of pattern formation more greatly in the trend of miniaturization of ULSI circuits.

A technique for correcting nonlinear errors occurring due to wafer warp and/or alignment mark corruption is disclosed in JP-A-6-291021 and JP-A-6-349707 though this is not a correction technique for nonlinear errors in laser position measurement. A scheme for using low- and high-pass filters to correct errors due to back rush of lead screws or coupling torsion in machinery for moving an object toward a target position is disclosed in JP-A-2004-171333. Some teachings as to low- and high-pass filters are found in JP-A-8-285538 and JP-A-3-152770.

As previously stated, the nonlinear errors are mixed in measurement results of the laser length meter using a laser interferometer for detection of a present position of the moving stage on a real-time basis. Theoretically, position data is in proportion or "linearity" to the distance between a target object and a measurement instrument; in reality, an output signal of the laser length meter contain errors due to possible optical path deviations. An example of such errors is a nonlinear error that occurs due to undesired interference between vertical and horizontal wave components as mixed in laser light. Such vertical and horizontal wave interference is occurred by reflection of a laser beam at a mirror in measurement optics. This kind of nonlinear error lowers the accuracy of the pattern formation, which poses a problem as to the incapability of accurate stage position measurements, resulting in the pattern write beam being irradiated or "shot" at deviant positions out of the target position on a workpiece mounted on the stage.

An approach to removing the nonlinear error components is to use a low-pass filter. Unfortunately, position offsets or displacements are still occurrable due to the filtering characteristics of such filter. Especially in the case of a stage as driven to move at varying speeds, the position measurement data signal experiences mixture of various nonlinear error components in addition to velocity-dependent nonlinear errors, such as acceleration-dependent nonlinear error components, variable acceleration errors, or other errors of higher order. This causes unacceptable displacement or "miss shot" of the pattern write beam on the workpiece surface.

BRIEF SUMMARY OF THE INVENTION

It is therefore an object of this invention to avoid the problems and provide a technique for correcting nonlinear errors to thereby achieve highly accurate position measurements.

In accordance with one aspect of the invention, a position measurement apparatus includes a movable stage structure, a measurement unit using a laser to measure a moved position of the stage and to output a corresponding measured value, a first filter configured to attenuate a first component of a certain frequency region of the measured value outputted by said measurement unit, a second filter connected in parallel with said first filter configured to attenuate a second component other than the certain frequency region of the measured value outputted by said measurement unit, a third filter connected in series to said second filter with the series connection of said second and third filters connected in parallel with the first filter, configured to attenuate the first component of said certain frequency region of the measured value outputted by said measurement unit, and a synthetic unit configured to combine an output of said first filter and an output of the series connection of the second and third filters and to thereby output a first combined value.

In accordance with another aspect of the invention, a pattern forming apparatus includes a movable stage supporting thereon a workpiece, a measurement unit configured to measure a moved position of said stage by use of a laser and to output a corresponding measured value, a low-pass filter for causing a the measured value of outputted by said measurement unit to pass therethrough while being set at a prespecified cut-off frequency, a first pair of low-pass and high-pass filters, each having a cut-off frequency being set equal to the prespecified cut-off frequency, for causing the measured value outputted by said measurement unit to pass therethrough, and a pattern writing unit responsive to receipt of a first combined value of an output of said low-pass filter and an output of said first pair of the low-pass and high-pass filters, for writing a pattern on the workpiece at a desired position thereof.

In accordance with yet another aspect of the invention, a position measurement method includes, measuring a moved position of a stage by using a laser, removing a nonlinear error component from a measured value by use of a low-pass filter being set to a predefined cutoff frequency, and correcting, by using a pair of low-pass and high-pass filters each having a cutoff frequency being set equal to said predefined cutoff frequency, a phase delay occurred in said measured value due to the use of said low-pass filter upon removal of the nonlinear error component.

In accordance with a further aspect of the invention, a position measurement method includes measuring a moved position of a stage by using a laser, removing a nonlinear error component from a measured value by use of a low-pass filter being set to a predefined cutoff frequency, and correcting occurrence of a velocity-proportional position deviation against said measured value by using a first pair of low-pass and high-pass filters each having a cutoff frequency identical to said predefined cutoff frequency.

In accordance with another further aspect of the invention, a writing method including measuring a moved position of a stage by using a laser, removing a nonlinear error component from a measured value by use of a low-pass filter being set to a predetermined cutoff frequency, and correcting, by using a first pair of low-pass and high-pass filters each having a cutoff frequency identical to said predetermined cutoff frequency, occurrence of a velocity-proportional position variation with respect to said measured value, and writing a pattern on said workpiece at a desired position in response to receipt of a first combined value of an output of said low-pass filter and an output of said first pair of low-pass and high-pass filters.

BRIEF DESCRIPTION OF THE DRAWINGS

FIG. 10 shows, in table form, exemplary sets of the gain and phase values of a signal passed through filter circuitry.

FIGS. 11A and 11B are graphs each showing a waveform of position measurement data, wherein the former is when the data is not passed through the combined filter embodying the invention whereas the latter is when passed through this filter.

FIGS. 21A-21B show transfer function equations of velocity-correctable digital filter circuitry.

FIGS. 24A-24B show transfer function equations of acceleration-correctable digital filter circuitry.

DETAILED DESCRIPTION OF THE INVENTION

Embodiment 1

Figure 1:
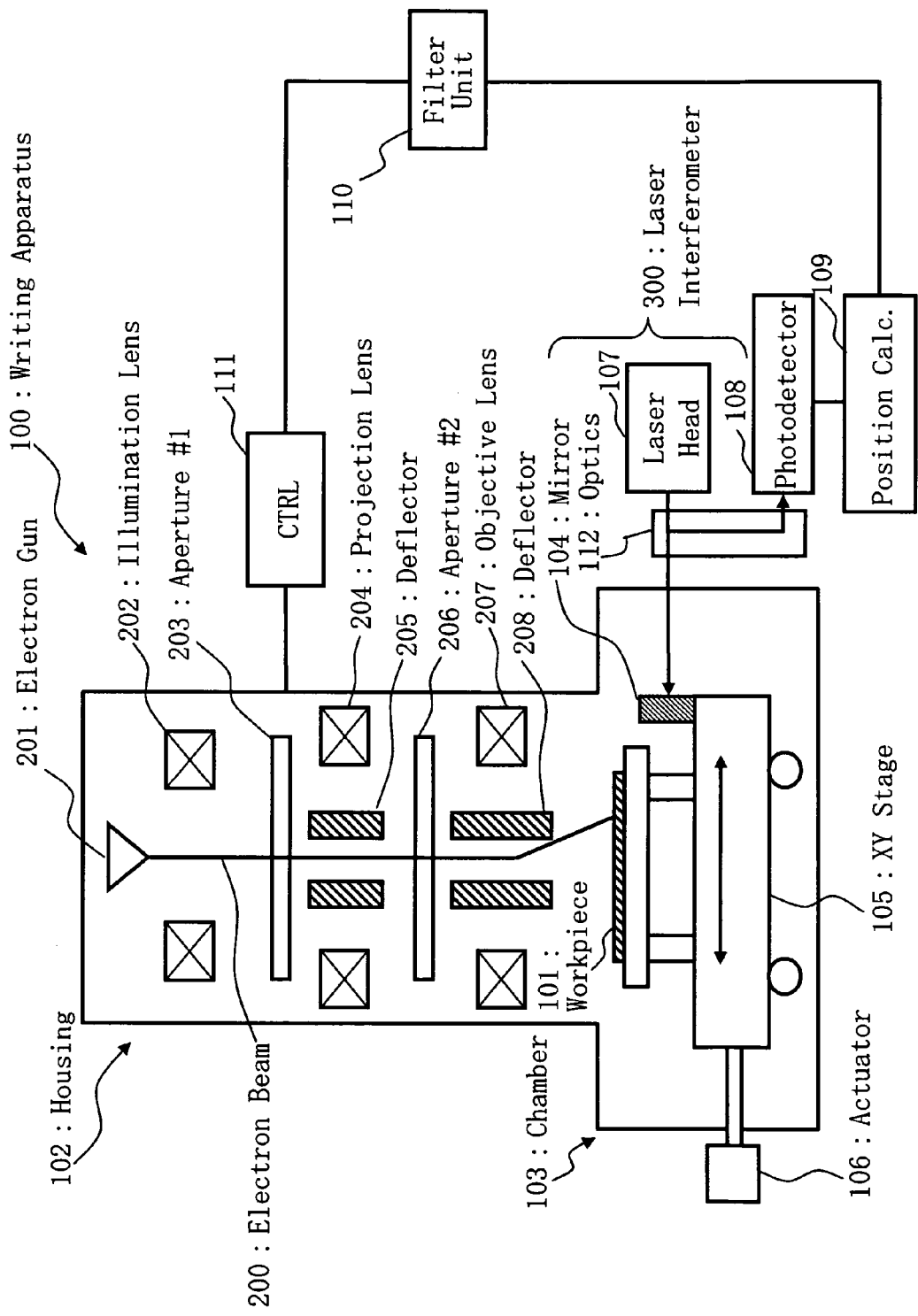
FIG. 1 is a diagram showing a configuration of a variable-shaped electron beam photolithography apparatus embodying the invention.

A variable-shaped electron beam (EB) writing apparatus 100 embodying the invention is shown in FIG. 1, which has an X-Y stage structure that is movable at a constant speed. As shown herein, the EB writing apparatus 100 includes a tower-like electron optics housing 102, called an electron lens barrel, a pattern writing chamber 103, a XY stage 105, and an actuator 106, as an example of writing or "drawing" unit. The writing apparatus 100 also includes a laser interferometer 300, as example of measurement unit, a position computing unit 109, a filter unit 110, and a pattern writing control circuit 111. Disposed in the barrel 102 are an electron gun assembly 201, illumination lens 202, upper or "first" aperture plate 203, projection lens 204, deflector 205, lower or "second" aperture plate 206, objective lens 207 and deflector 208. The laser interferometer 300 includes a light head 107, which may be a laser source for projecting a beam of laser light. Also included in the interferometer 300 are a mirror 104, optical lens system or "optics" 112, and light receiver module 108.

An electron beam 200 leaving the electron gun 201 passes through the illumination lens 202 to enter the first aperture 203, which has a rectangular beam-shaping opening or hole. Passing this hole results in the electron beam 200 being shaped to have a rectangular cross-section. Then, the electron beam 200 is guided by the projection lens 204 to reach the second aperture 206. A first aperture image on second aperture 206 is position-controlled by the deflector 205 so that the beam changes in shape and in size dimensions. After having passed through second aperture 206, the electron beam 200 with a second aperture image is focus-adjusted by the objective lens 207 and then deflected by the deflector 208 to finally fall onto a target workpiece 101 at a desired position thereon, which workpiece is placed on the movable XY stage 105 in chamber 103.

Figure 2:
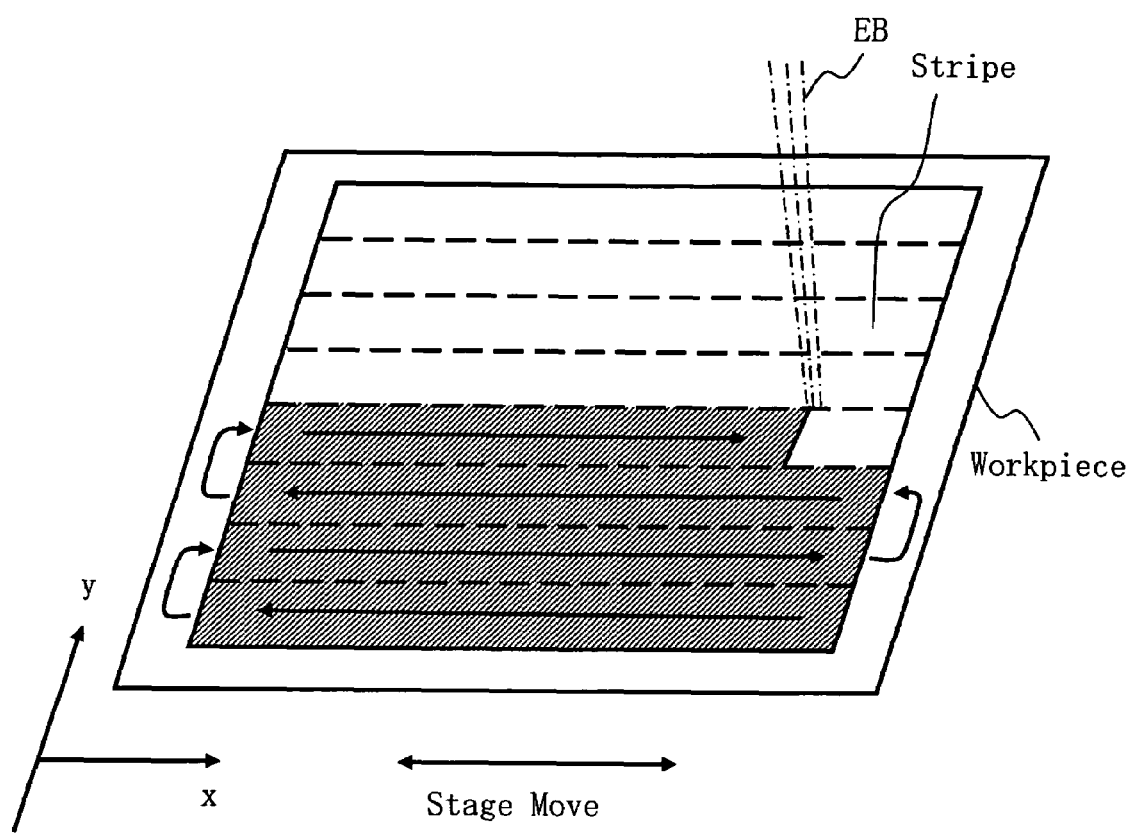
FIG. 2 shows a perspective view of a workpiece which is placed on a movable stage.

As shown in FIG. 2, the workpiece 101 has an exposure surface on which a pattern image is to be written. This surface is virtually subdivided into a plurality of strip-like beam-deflectable portions. When writing the pattern on workpiece 101, the XY stage 105 is driven by the actuator 106 to move or slide continuously in the X direction so that the incoming electron beam 200 scans one stripe area along the length thereof. During the continuous movement of XY stage 105 in the X direction, let the shot position of electron beam on workpiece 101 follow or "trace" the stage motion in a way synchronous therewith. This makes it possible to shorten a time taken to complete the pattern depiction required. After having written a pattern in one stripe of workpiece 101, the XY stage 105 is driven by the actuator 106 to move in step along the Y direction and then move backward in X direction so that the incoming beam scans the next stripe for execution of pattern writing thereto. In other words, XY stage 105 alternately performs continuous forward/backward movements in X direction and movements in steps along Y direction, thereby permitting the beam 200 to scan respective exposure stripes of workpiece 101 on XY stage 105 in a serpentine fashion. With this serpentine stage motion control, it is possible to minimize any possible idle time during movement of XY stage 200, thereby to increase or maximize the efficiency of stage motion-control operation.

Figure 3:
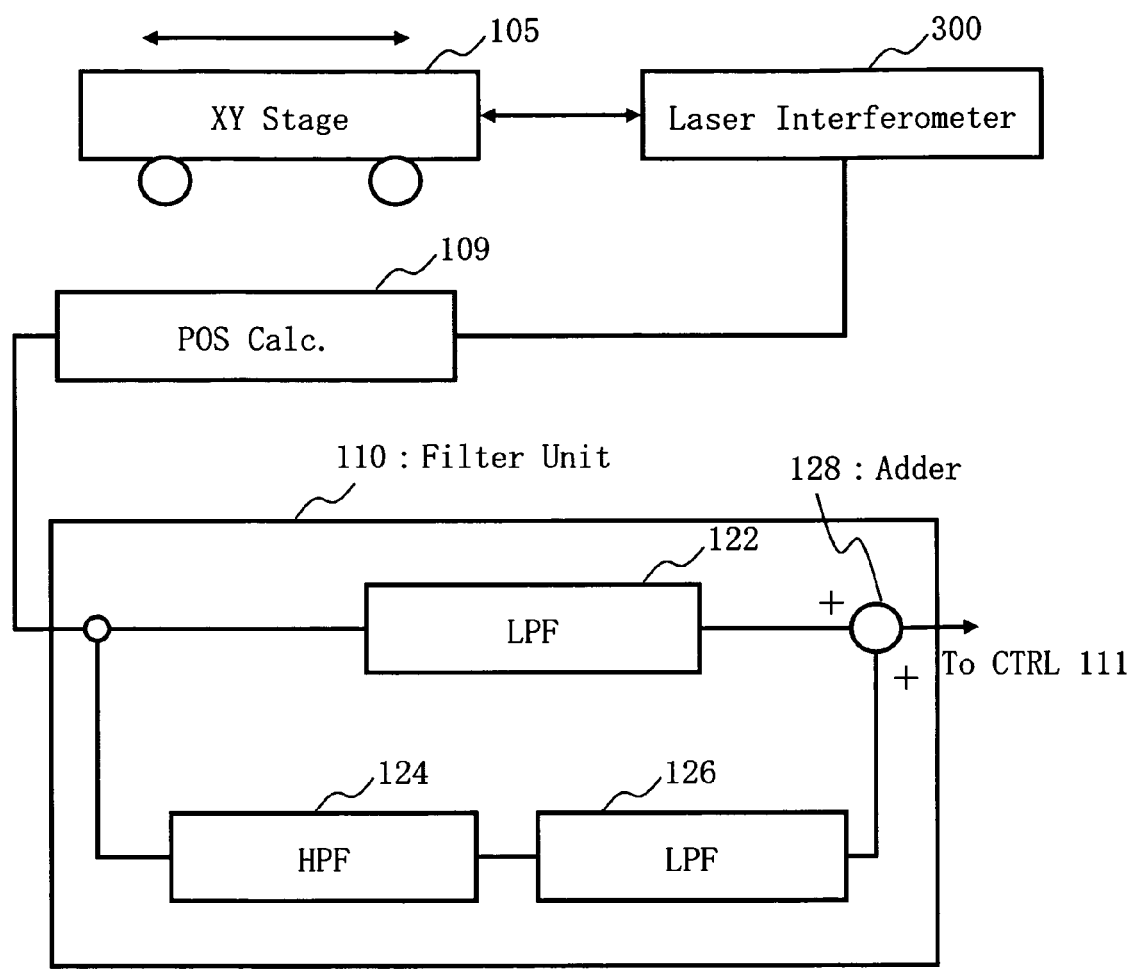
FIG. 3 is a block diagram showing an internal configuration of a filter unit in the apparatus of FIG. 1.

An internal configuration of the filter unit 110 is shown in FIG. 3. The laser interferometer 300, as an example of laser-assisted distance measurement system, operates to optically measure and detect a present position of the moving XY stage 105 in the chamber 103 and generate at its output an electrical signal indicative of a measured position value, which is supplied to the position calculator 109 for conversion into position measurement data. This data is then passed to the filter unit 110 so that it passes through a low-pass filter (LPF) 122 having a preset cut-off frequency. The position data also passes through a series combination of a high-pass filter (HPF) 124 and an LPF 126 each having its cutoff frequency being set identical to the cutoff frequency of LPF 122. A pair of the HPF 124 and the LPF 126 is connected in parallel the LPF 122. The Resultant filtering-processed data signals as output from LPF 122 and the pair of the HPF 124 and the LPF 126 are then sent forth to a signal synthesis circuit 128, which combines them together. This circuit 128 may be an adder. An output signal of adder 128 indicative of the resulting added or "synthesized" value is passed to the pattern write controller 111 shown in FIG. 1.

Figure 4:
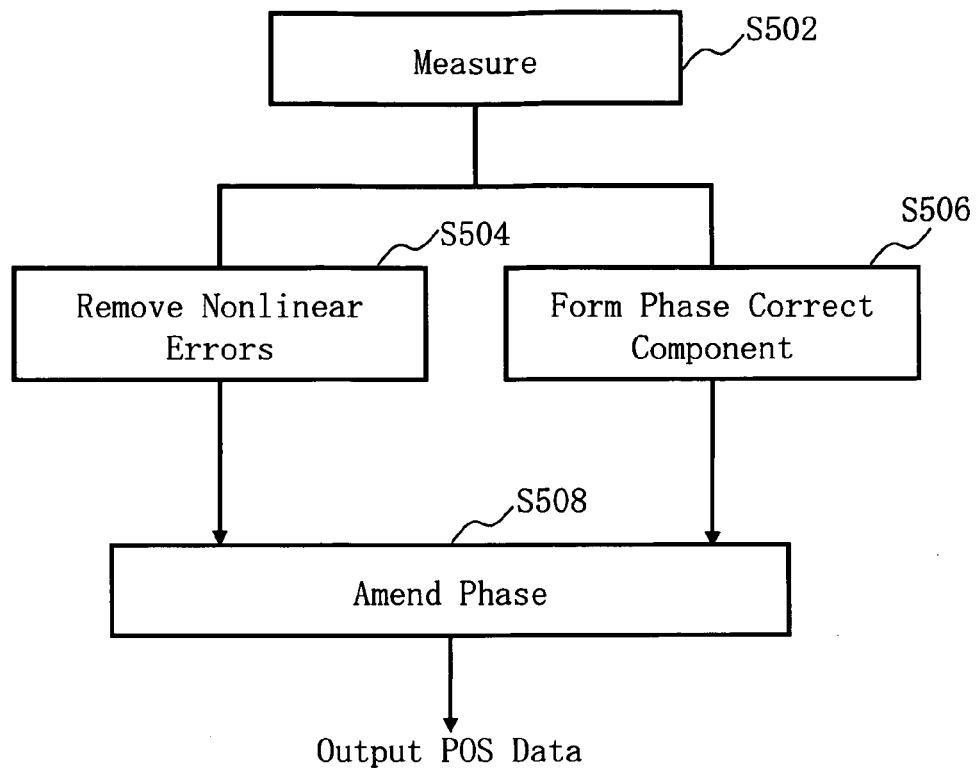
FIG. 4 is a flow chart of a position measurement method for use in the apparatus of FIG. 1.

See FIG. 4, which is a flow chart of a stage position measurement method for use in the EB lithography apparatus of FIG. 1. As shown, this method start with step S502 which causes the laser interferometer 300 to measure a present position of the movable XY stage 105 in the chamber 103. More specifically, a laser beam leaving the laser head 107 is guided by the optics 112 to hit the mirror 104 of XY stage 105, resulting in production of a reflected beam therefrom, which is then returned via optics 112 to the photodetector 108. Upon receipt of the reflected beam, this detector generates at its output an electrical signal indicative of the present stage position value thus measured. This measured value is then sent to the position calculator 109 for conversion to a stage position data signal. As previously stated, this position data can often contain nonlinear error components.

Figure 5:
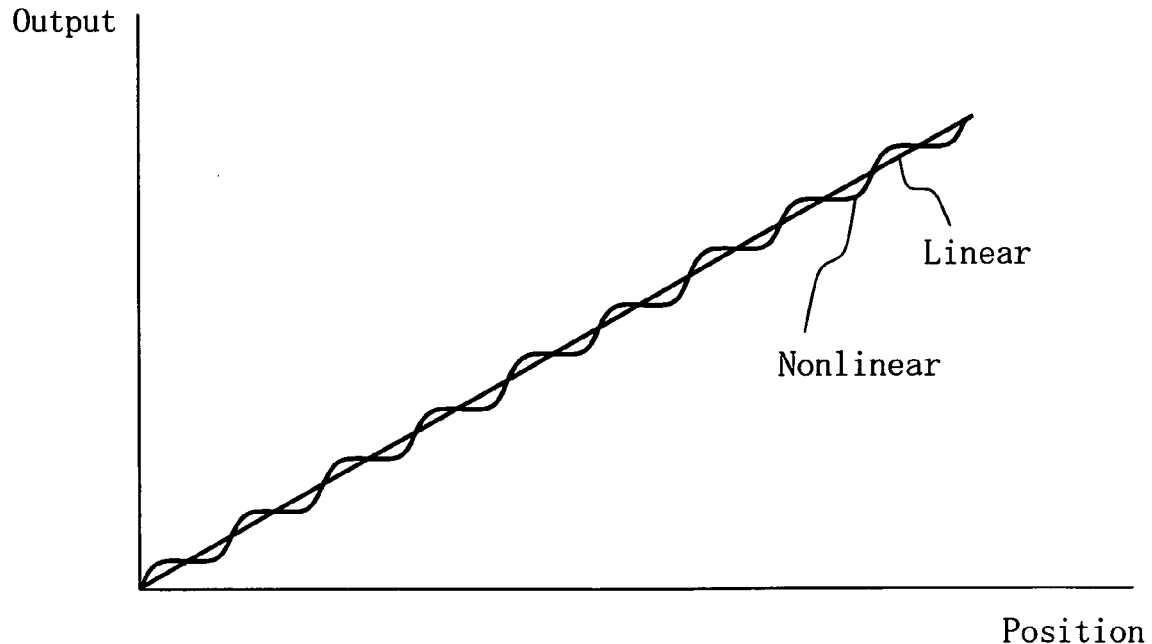
FIG. 5 is a graph showing a relationship between a measurement output and a present position of the stage.

A typical relation of XY stage position versus measurement output is graphically shown in FIG. 5. Ideally, the distance between a measurement instrument and a target object must be proportional or linear to its corresponding position data. However, in reality, nonlinear error components are contained therein due to the presence of unavoidable optical-path problems in the case of laser-assisted distance measurements as shown in FIG. 5. In practical applications, such nonlinear errors are occurred by unwanted interference between vertical and horizontal waves being mixed in the laser light used. In other words, the beam reflection at the mirror or else in the laser length meter device results in horizontal wave components interfering with vertical waves and vice versa, which leads to occurrence of nonlinear errors. The result of this is generation of measurement data with such nonlinear errors being overlaid or "superposed" onto the linear component.

At step S504 of FIG. 4, the above-noted nonlinear error components are removed away. More specifically, remove the nonlinear error components from the measured value obtained at step S502. Usually these nonlinear error components are high-frequency components relative to the "pure" position data component of XY stage 105, so letting the measurement signal to pass through the LPF 122 as a first filter of FIG. 3 enables attenuation of a frequency region that contains the high-frequency nonlinear error components at a prespecified cutoff frequency from the position component data as has been converted from the measurement value of the laser interferometer 300.

Figure 6A:
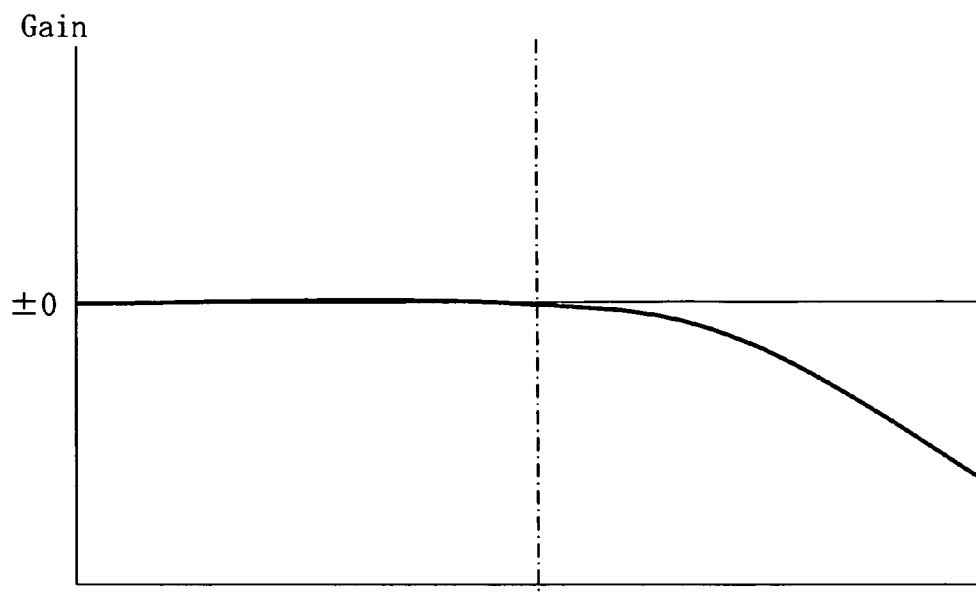
FIG. 6A is a graph showing a curve of gain versus frequency of low-pass filtered position measurement data.
Figure 6B:
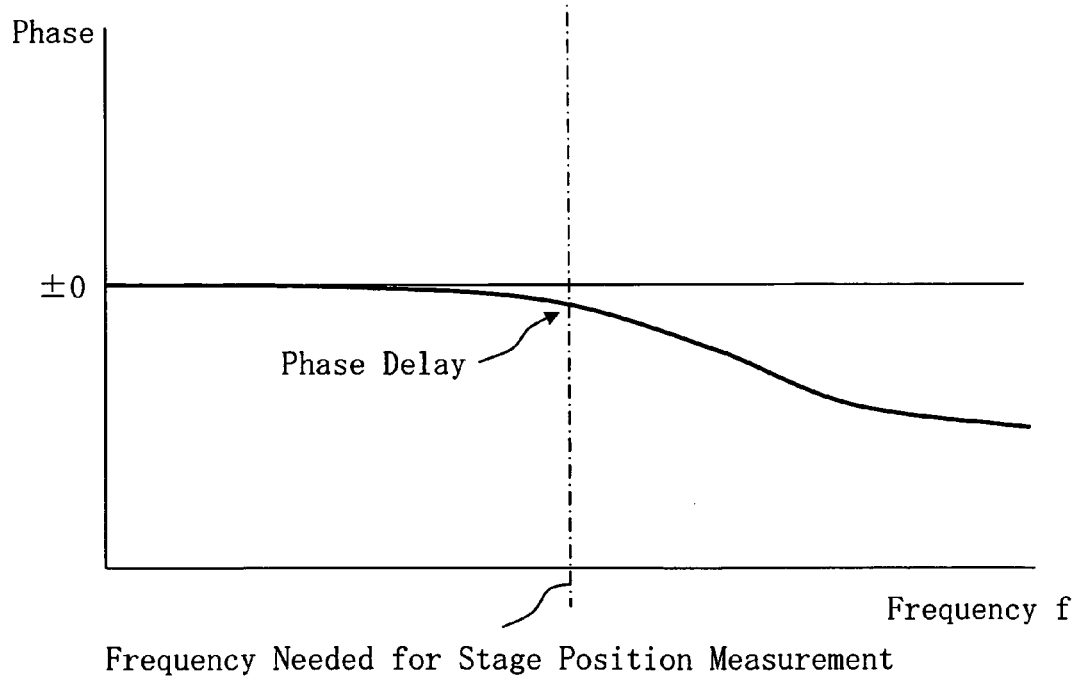
FIG. 6B shows a plot of phase versus frequency.

As shown in FIG. 6A, when letting the output signal of position calculator 109 pass through LPF 122 having the prespecified cutoff frequency, the resulting measured data signal is attenuated in its frequency region that contains the high-frequency nonlinear error components. This makes it possible to remove such nonlinear error components away from the position data as has been converted from the measured value of the laser interferometer 300. However, as shown in FIG. 6B, this low-pass filtering would result in occurrence of a delay in phase of the position data. If this data is directly used to determination of a present position of XY stage 105, then the signal phase delay lowers the real-time responsibility, which in turn causes a deviation of beam irradiation position as will be described later.

At step S506 of FIG. 4, signal phase correction is performed for deletion of the above-stated phase delay. To do this, let the output measurement data of the position calculator 109 pass through the series-circuit of HPF 124 and LPF 126, which is connected in parallel with LPF 122. Letting it pass through HPF 124 as a second filter causes those frequency components other than the frequency region being attenuated by LPF 122 to attenuate from the measured value at the same cutoff frequency as that of LPF 122.

In addition, letting the measurement data signal further pass through the LPF 126 as a third filter at the post stage of HPF 124 causes those frequency components other than the frequency region attenuated by LPF 122 to attenuate from the measured value at the same cutoff frequency as that of LPF 122.

Figure 7A:
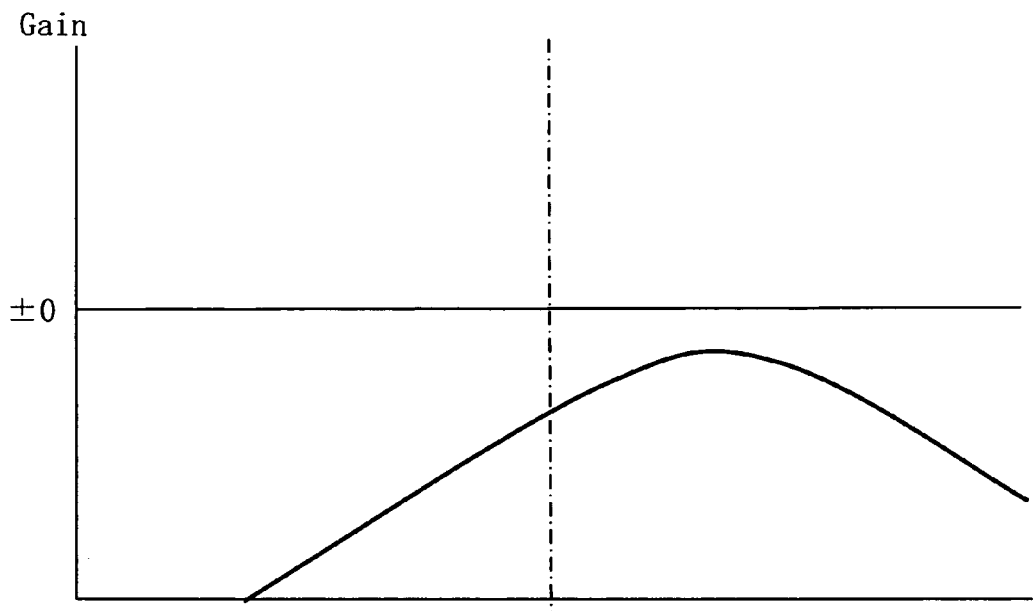
FIG. 7A is a graph showing a curve of gain versus frequency of high-pass and low-pass filtered position data.
Figure 7B:
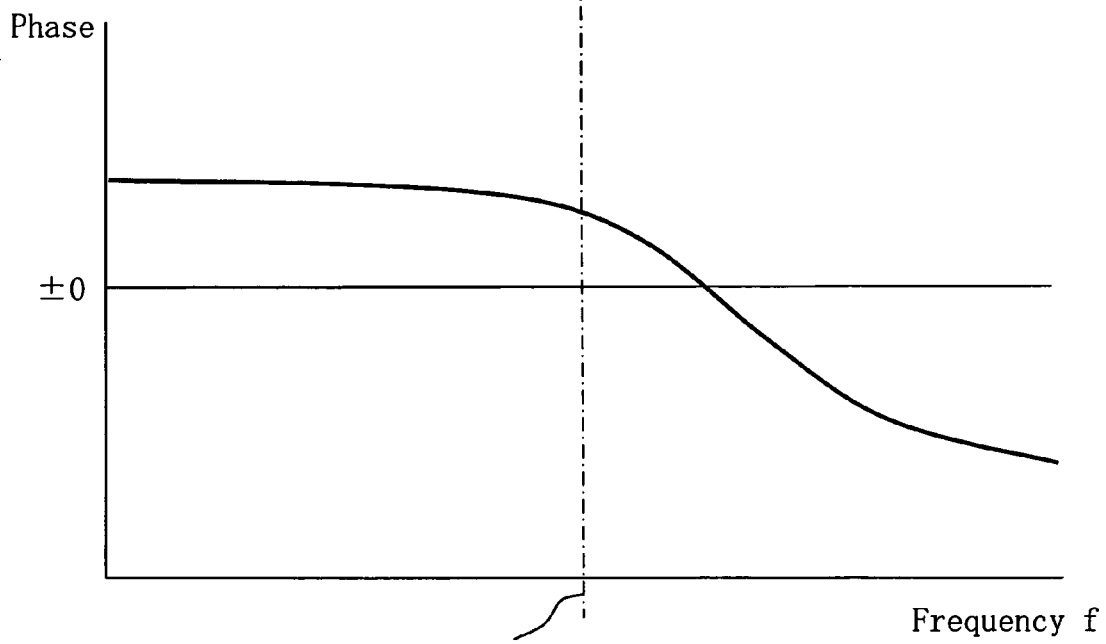
FIG. 7B shows a plot of phase vs. frequency.

The frequency dependence of the gain of the position data signal which has passed through the pair of series-coupled HPF 124 and LPF 126 is shown in FIG. 7A. The frequency dependence of the phase of it is plotted in FIG. 7B. As shown in FIG. 7B, the high-pass filtering using the HPF 124 permits the position data signal to advance in phase. And, as shown in FIG. 7A, the components other than the frequency region to be attenuated by the "stand-alone" LPF 122 is attenuated prior to the filtering. Further, by the low-pass filtering by LPF 126, the component of the same frequency region as that of the LPF 122-attenuated frequency region is attenuated. Thus, a phase-advanced data signal is formed to have both-side frequency regions that are attenuated at the same cutoff frequency as that of LPF 122.

At step S508, phase correction is carried out to compensate a phase delay of the position data signal which has occurred due to the use of LPF 122. More specifically, the adder 128 of FIG. 3 adds together the outputs of LPFs 122 and 126—i.e., the measured position data signal from the position calculator 109 which passed through LPF 122 and another version of this data signal which passed through the paired HPF 124 and LPF 126—to generate an output signal indicative of the added value of them, which signal is then supplied to the pattern write controller 111.

Figure 8A:
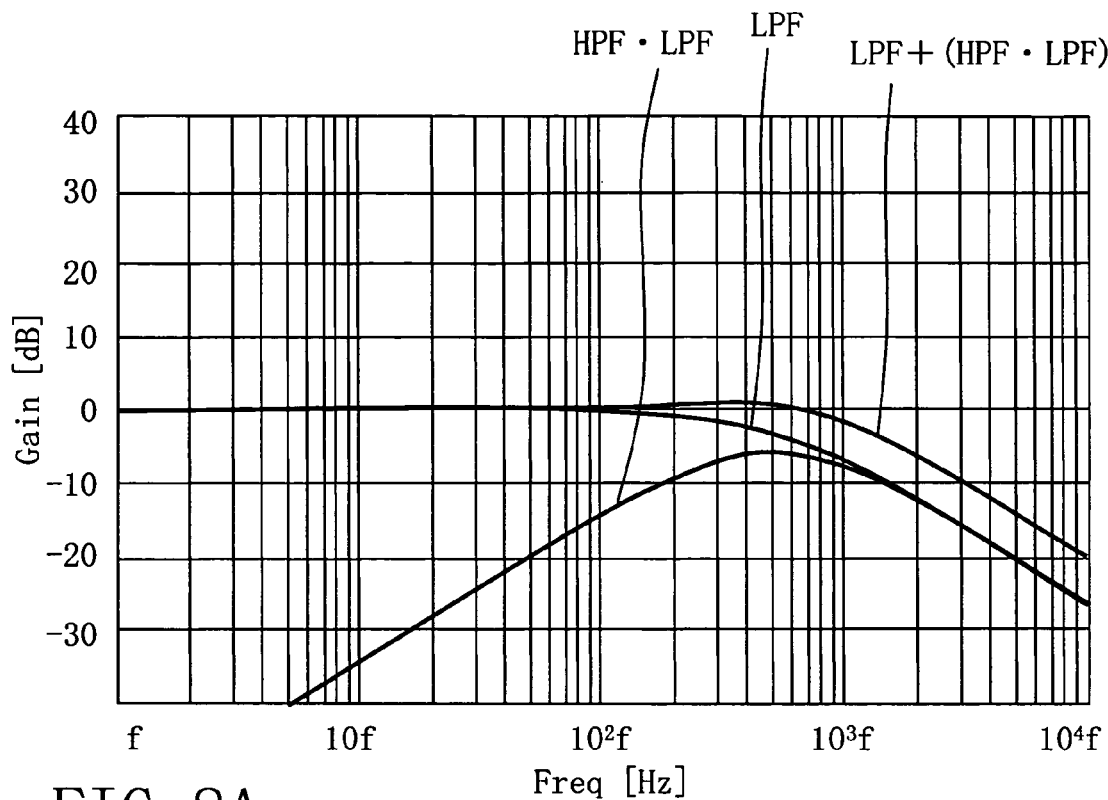
FIG. 8A is a graph showing a curve of gain versus frequency of a combined data of low-pass filtered position data and HPF/LPF-passed position data.
Figure 8B:
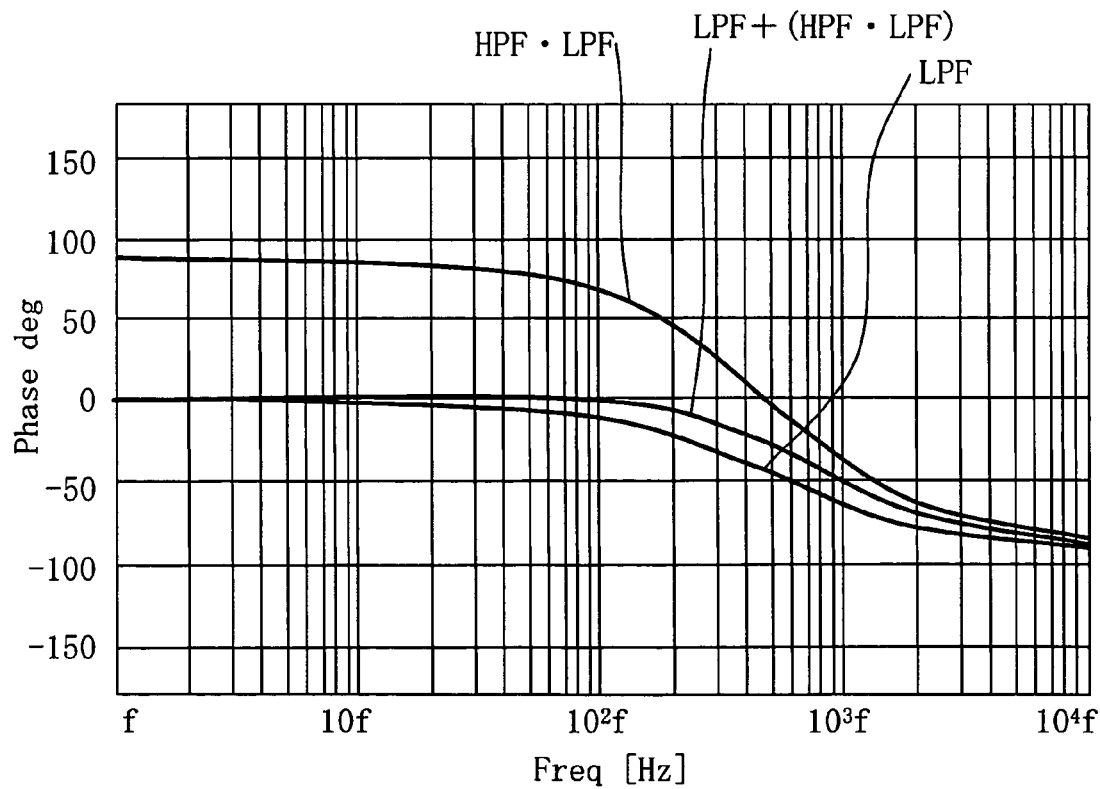
FIG. 8B shows a plot of phase vs. frequency.

The frequency dependence curves of the gain and phase of the added value signal as output from the adder 128 are shown in FIGS. 8A and 8B, respectively. As shown in FIG. 8B, combining two versions of filtered data signals together makes it possible to correct the phase delay and to shift toward the high frequency side a frequency region in which the phase delay begins. It is also possible to shift a gain attenuation startup position toward high frequency side by certain degree as demonstrated by the graph of FIG. 8A.

To prevent the gain and phase from deviating in the frequency region required, the cutoff frequencies of the LPF 122 and the series-coupled HPF 124 and LPF 126 are adequately adjusted. This enables removal of nonlinear error components while suppressing unwanted phase offsets.

In the filter unit 110 shown in FIG. 3, any one of HPF 124 and LPF 126 may be placed in the upstream or "primary" side. Similar results are obtainable by modifying the series-coupled HPF 124 and LPF 126 so that LPF 126 proceeds HPF 124 in order of connection.

An example of the two-way combined filter unit 110 is a digital filter, which is installable as a software program in a field programmable gate array (FPGA) chip. In other words, the filter unit is configurable in the form of a computer-executable software program or a combination of hardware and software configurations or a combination with firmware. The program is prestored in storage media, such as removable or fixed magnetic disks, magnetic tapes, floppy diskettes (FDs), read-only memories (ROMs) or any equivalents thereto.

Figures 9A, 9B:
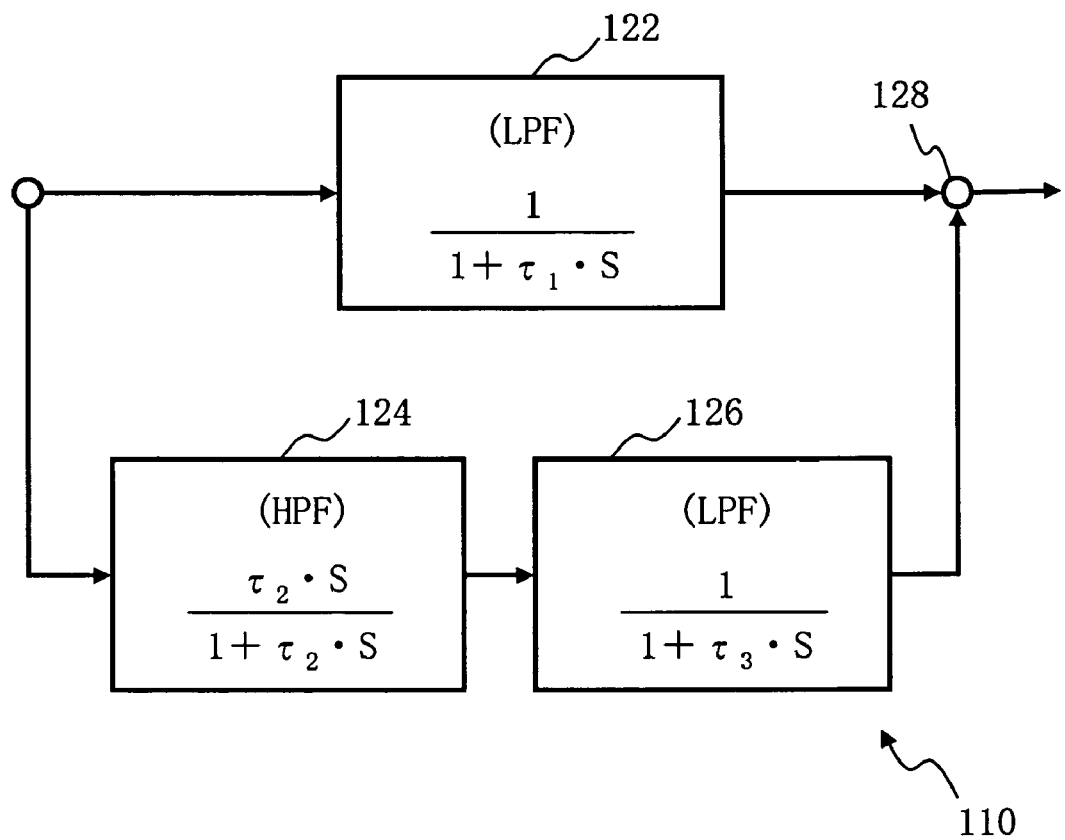
FIG. 9A shows a transfer function equation of digital filter.
FIG. 9B shows a modelized configuration of the filter unit in FIG. 3.

The digital filter is designed to have its transfer function G(S) as represented by Equation shown in FIG. 9A. This transfer function is defined by a combination of three transfer functions of the LPF 122 and the series-coupled HPF 124 and LPF 126 as shown in FIG. 9B. In this equation, "$f_n$" is the cutoff frequency, $\tau_n$ is the time constant (where, $\tau_n = 1/(2\Pi f_n)$), and S is the Laplace operator. As shown in FIG. 9B, the transfer function of LPF 122 is given by $1/(1+\tau_1 \cdot S)$. The transfer function of HPF 124 is given as $\tau_2 \cdot S/(1+\tau_2 \cdot S)$ whereas that of LPF 126 is as $1/(1+\tau_3 \cdot S)$. Thus, the total transfer function G(S) of the combined digital filter 110 is represented by:

$$G(S)=1/(1+\tau_1 \cdot S)+\tau_2 \cdot S/(1+\tau_2 \cdot S) \cdot 1/(1+\tau_3 \cdot S).$$

Preferably, the series-coupled HPF 124 and LPF 126 are the same in cutoff frequency as each other although slight deviations are permissible within a range which offers the above-stated nonlinear error component removability and phase delay correctability. Obviously in the case of the same cutoff frequency, $\tau_1=\tau_2=\tau_3$ in Equation above.

A list of exemplary gain and phase variations of a filtered data signal is shown in FIG. 10 in table form. Suppose that the LPF 122 and the pair of series-coupled HPF 124 and LPF 126 have cutoff frequency values $f_1$, $f_2$ and $f_3$. Letting $f_1=f_2=f_3$, the frequency is set to 5 kHz, to 3 kHz and then to 1 kHz. The gain and phase change values in each case are shown in the table, which values are measured when the frequency f is at 100 Hz and 6.3 kHz for each case. Assume that the XY stage 105 is driven to continuously move at a constant speed of 1 millimeter per second (mm/s). It can be seen that when the same cutoff frequency is set to 1 kHz during XY-stage position detection, any appreciable gain/phase changes are hardly found in the case of the frequency value of 100 Hz whereas relatively large (32% attenuated) gain changes corresponding to nonlinear error components take place in the case of 6.3 kHz frequency. This demonstrates that the combined-filtering using the digital filter 110 results in removal of nonlinear error components while avoiding or minimizing phase delays.

One typical waveform of a measured data signal which does not experience the combined-filtering by the digital filter 110 is shown in FIG. 11A. By viewing this graph, it can be seen that such signal suffers from significant variations or "swings" in amplitude due to the presence of nonlinear error components. On the contrary, letting the signal pass through the digital filter 110 results in the signal becoming less in amplitude variations. This is because such nonlinear error components are removed away therefrom by applying thereto the combined-filtering embodying the invention.

By supplying to the control circuit 111 the resultant XY-stage position measurement data signal with phase delays being corrected and also with nonlinear error components being removed therefrom, it is possible to increase the accuracy of detection of a present position of the moving XY stage 105. Using this high-accuracy position data enables the controller 111 to increase in processing accuracy accordingly. Then, controller 111 controls the electron optics and deflector(s) 205, 208 of the variable-shaped electron beam pattern generator in the barrel 102 so that the electron beam 200 falls onto the workpiece 101 as placed on the continuously moving XY stage 105 in the chamber 103 while keeping track of a desired position, resulting in accurate depiction or "writing" of a prespecified pattern on workpiece 101.

The combined filter 110 may also be built in stepper or scanner apparatus of the type using continuous stage motion schemes. Usually in such apparatus, a mask-supporting stage is driven to move at a steed of 2,000 mm/s whereas a mask stage is moved at 500 mm/s. In this case also, high-accuracy position measurements are achievable.

Obviously, the slower the stage moves, the lower the frequency of nonlinear error components; the faster the stage moves, the higher the frequency of nonlinear error components. Accordingly, when compared to using the combined filtering technique for position detection of the XY stage 105 that continuously moves relatively slowly—e.g., at the speed of 1 mm/s—as in the EB lithography apparatus 100 embodying the invention, the nonlinear error components occurrable during position detection of the mask or wafer stage of a stepper or scanner tend to increase in frequency. In view of this, applying the combined filtering thereto, more appreciable attenuation is attainable, resulting in achievement of more successful removal of such nonlinear error components.

As apparent from the foregoing disclosure, the position measurement apparatus includes the movable stage structure, the measurement unit using the laser to measure a moved position of the stage. The position measurement apparatus also includes the first filter operative to attenuate a component of a certain frequency region from a measured value of the measurement unit, the second filter connected in parallel with the first filter for attenuating a component other than the certain frequency region from the measured value of the measurement unit, the third filter connected in series to the second filter for attenuating the component of the certain frequency region from the measured value of the measurement unit. The position measurement apparatus also includes the synthetic unit for combining together the measured value of the measurement unit which passed through the first filter and the measured value of the measurement unit that passed through the second and third filters to thereby output a combined value.

With such the combined filtering arrangement, it is possible to correct phase deviations or offsets—these are occurred while letting the "raw" position measurement data signal pass through the first filter having its cutoff frequency set in the region of nonlinear errors for removal of nonlinear error components from the measured value—by adding thereto for synchronization another version of the measured value data signal that has separately passed through the series-coupled second and third filters.

Another feature is that the first filter is a low-pass filter whereas the series-coupled second and third filters are arranged so that either one of them is a low-pass filter and the other is a high-pass filter.

In view of the fact that the nonlinear error components are usually higher in frequency than the XY-stage motion, using the low-pass filter as the first filter makes it possible to remove such high-frequency nonlinear error components. Using the high-pass filter as the second or third filter makes it possible to advance the phase in the opposite direction to a phase delay occurring due to the filtering at the first filter. Use of the low-pass filter as the other of the second and third filters prevents such nonlinear error components from being again contained in the added position detection data signal while at the same time minimizing any possible phase delays.

The writing apparatus includes the movable stage supporting thereon a workpiece, the measurement unit operative to measure a moved position of the stage by use of a laser. The writing apparatus also includes the low-pass filter for causing a measured value of the measurement unit to pass therethrough while being set at a prespecified cut-off frequency, and the pair of a low-pass filter and a high-pass filter for causing the measured value of the measurement unit to pass therethrough while letting a cutoff frequency of the pair be set equal to the prespecified cutoff frequency. The writing apparatus also includes the pattern writing unit responsive to receipt of a combined value of the measured value of the measurement unit which passed through the lowpass filter and the measured value of the measurement unit that passed through the paired lowpass and highpass filters for forming a pattern on the workpiece at a desired position thereof.

Setting the cutoff frequency of lowpass filter to enable cutaway of nonlinear error components makes it possible to remove the nonlinear error components away from the measured data signal as output from the measurement unit. Phase delays occurrable due to execution of the lowpass filtering are correctable by the series-coupled highpass and lowpass filters. This in turn permits the pattern generator unit to draw or "write" a specified pattern at a desired position on the target workpiece in response, on a real-time basis, to receipt of the XY-stage position detection signal with the nonlinear error components being removed therefrom.

Another feature lies in that the pattern writing unit irradiates a charged particle beam onto the workpiece while deflecting the beam based on the combined value of the measured value of the measurement unit which passed through the lowpass filter and the measured value of the measurement unit that passed through the paired lowpass and highpass filters.

Deflecting the charged particle beam in responding to the synthesized value makes it possible to irradiate it at a target position with increased precision.

The position measurement technique for use in each apparatus stated above may be defined as a position measurement method which includes the steps of measuring a moved position of a stage by using a laser, removing a nonlinear error component from a measured value by use of a lowpass filter being set to a predefined cutoff frequency, and correcting, by using a pair of lowpass and highpass filters each having a cutoff frequency being set equal to the predefined cutoff frequency, a phase delay as occurred in said measured value due to the use of the lowpass filter upon removal of the nonlinear error component.

It has been stated that the illustrative method and apparatus offer the enhanced nonlinear error component removability while retaining maximally increased phase delay correctability, thereby enabling achievement of high-accuracy position measurements. This makes it possible to perform high-accuracy pattern drawing or "writing" on the target workpiece.

Embodiment 2

In Embodiment 2 XY stage 105 is driven to move at constantly increasing and decreasing speeds with fixed acceleration. A variable-shaped electron beam writing apparatus in accordance with embodiment 2 is similar to that shown in FIG. 1, expect an internal configuration of the filter unit 110. the EB writing apparatus 100 includes a tower-like electron optics housing 102, called an electron lens barrel, a pattern writing chamber 103, a XY stage 105, and an actuator 106, as an example of writing or "drawing" unit. The writing apparatus 100 also includes a laser interferometer 300, as example of measurement unit, a position computing unit 109, a filter unit 110a, and a pattern writing control circuit 111. Disposed in the barrel 102 are an electron gun assembly 201, illumination lens 202, upper or "first" aperture plate 203, projection lens 204, deflector 205, lower or "second" aperture plate 206, objective lens 207 and deflector 208. The laser interferometer 300 includes a light head 107, which may be a laser source for projecting a beam of laser light. Also included in the interferometer 300 are a mirror 104, optical lens system or "optics" 112, and light receiver module 108.

An electron beam 200 leaving the electron gun 201 which is similar to embodiment 1, passes through the illumination lens 202 to enter the first aperture 203, which has a rectangular beam-shaping opening or hole. Passing this hole results in the electron beam 200 being shaped to have a rectangular cross-section. Then, the electron beam 200 is guided by the projection lens 204 to reach the second aperture 206. A first aperture image on second aperture 206 is position-controlled by the deflector 205 so that the beam changes in shape and in size dimensions. After having passed through second aperture 206, the electron beam 200 with a second aperture image is focus-adjusted by the objective lens 207 and then deflected by the deflector 208 to finally fall onto a target workpiece 101 at a desired position thereon, which workpiece is placed on the movable XY stage 105 in chamber 103.

The workpiece 101 which is similar to that shown in FIG. 2, has an exposure surface on which a pattern image is to be written. This surface is virtually subdivided into a plurality of strip-like beam-deflectable portions. When writing the pattern on workpiece 101, the XY stage 105 is driven by the actuator 106 to move or slide continuously in the X direction so that the incoming electron beam 200 scans one stripe area along the length thereof. During the continuous movement of XY stage 105 in the X direction, let the shot position of electron beam on workpiece 101 follow or "trace" the stage motion in a way synchronous therewith. This makes it possible to shorten a time taken to complete the pattern depiction required. After having written a pattern in one stripe of workpiece 101, the XY stage 105 is driven by the actuator 106 to move in step along the Y direction and then move backward in X direction so that the incoming beam scans the next stripe for execution of pattern writing thereto. In other words, XY stage 105 alternately performs continuous forward/backward movements in X direction and movements in steps along Y direction, thereby permitting the beam 200 to scan respective exposure stripes of workpiece 101 on XY stage 105 in a serpentine fashion. With this serpentine stage motion control, it is possible to minimize any possible idle time during movement of XY stage 200, thereby to increase or maximize the efficiency of stage motion-control operation.

Figure 12:
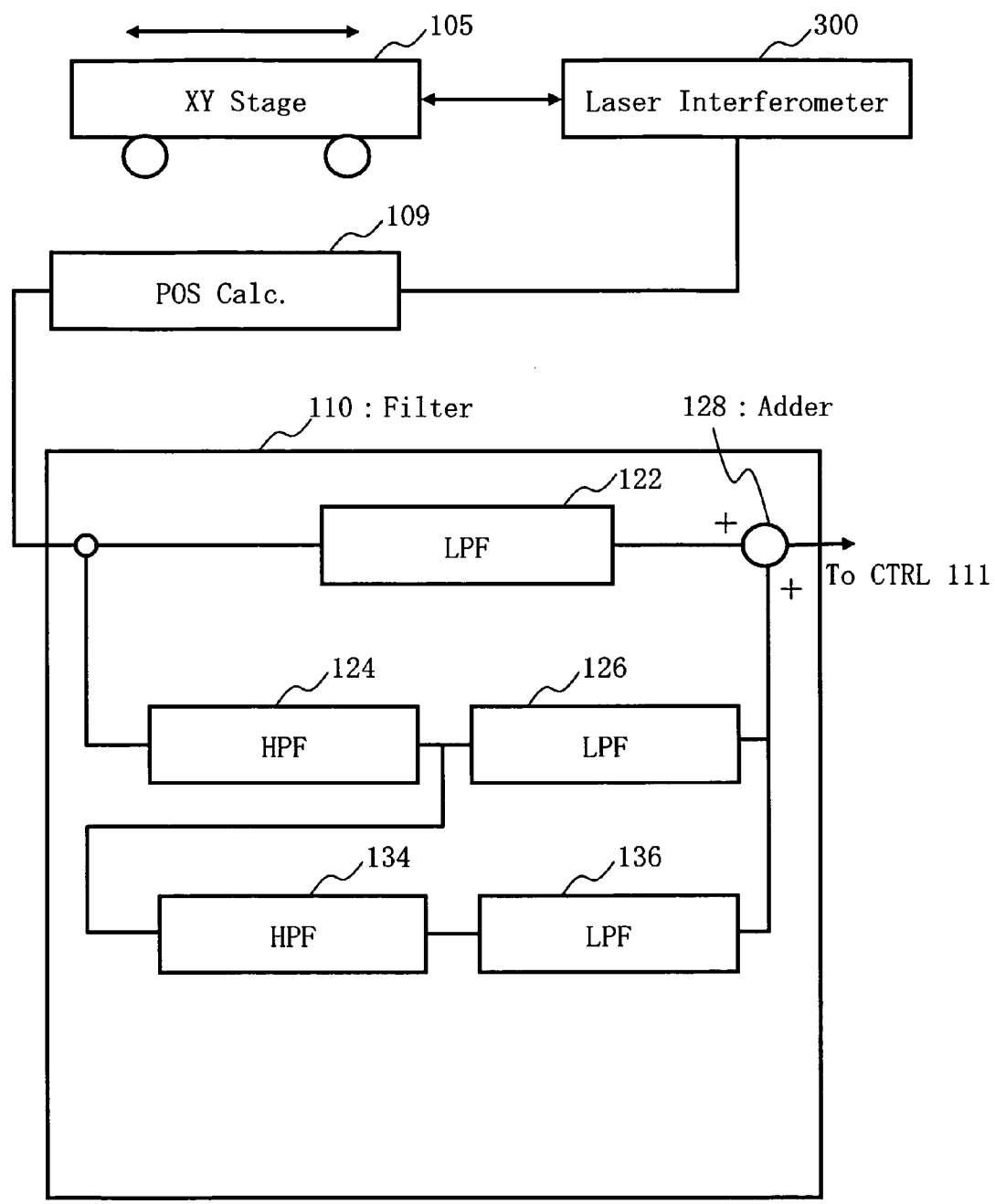
FIG. 12 shows an internal configuration of a filter unit in accordance with an embodiment 2.

FIG. 12 shows a block diagram of an internal configuration of a filter unit 110 in accordance with a embodiment 2. Upon receipt of an output signal of the laser interferometer 300 which indicates a present position of the moving XY stage 105, the position calculator 109 converts it to a position component data signal indicating the measured position data. This data is supplied to the LPF 122 and the first pair of HPF 124 and LPF 126 in a similar way to the embodiment stated supra. A highpass-filtered signal as output from the HPF 124 is also sent to the "second" pair of series-coupled HPF 134 and LPF 136. The second pair of HPF 134 and LPF 136 is connected in parallel with the LPF 126 of the "first" pair, and in series to the HPF 124 of the "first" pair. These HPF 134 and LPF 136 are the same in cutoff frequency as the LPF 122. Output signals of the LPF 122 and first pair of HPF 124 and LPF 126 and the second pair of HPF 134 and LPF 136 are combined together by an adder 128 to provide an addition result data signal, which is then passed to the pattern write controller 111.

Figure 13:
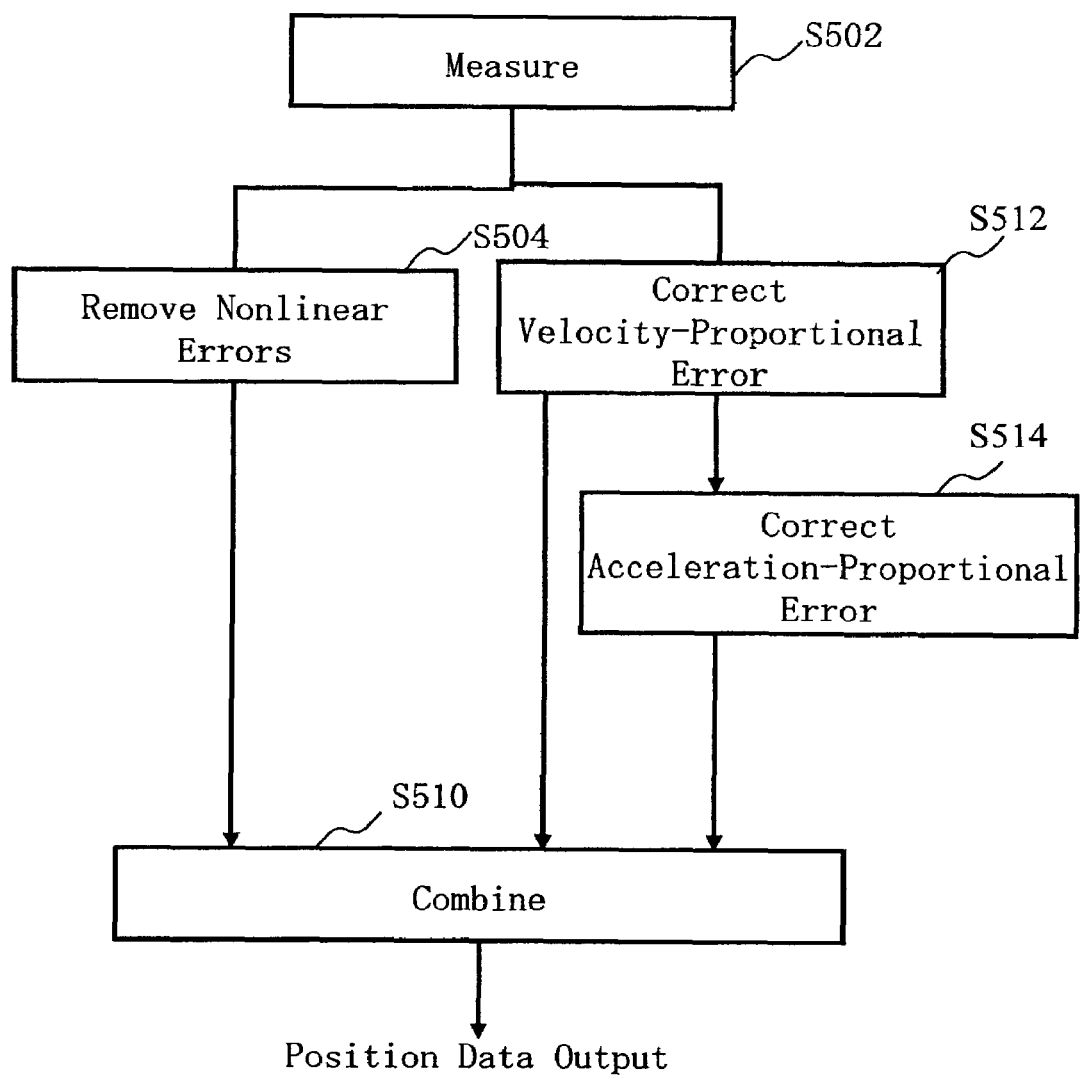
FIG. 13 is a flowchart of major steps of a position measurement method adaptable for use with the apparatus.

A stage position measurement method for use in the EB lithography tool also embodying the invention is shown in a flowchart of FIG. 13. At step S502, XY-stage position measurement is done in a similar way to the step S502 shown in FIG. 4. As shown, this method start with step S502 which causes the laser interferometer 300 to measure a present position of the movable XY stage 105 in the chamber 103. More specifically, a laser beam leaving the laser head 107 is guided by the optics 112 to hit the mirror 104 of XY stage 105, resulting in production of a reflected beam therefrom, which is then returned via optics 112 to the photodetector 108. Upon receipt of the reflected beam, this detector generates at its output an electrical signal indicative of the present stage position value thus measured. This measured value is then sent to the position calculator 109 for conversion to a stage position data signal. As previously stated, this position data can often contain nonlinear error components.

Figure 14:
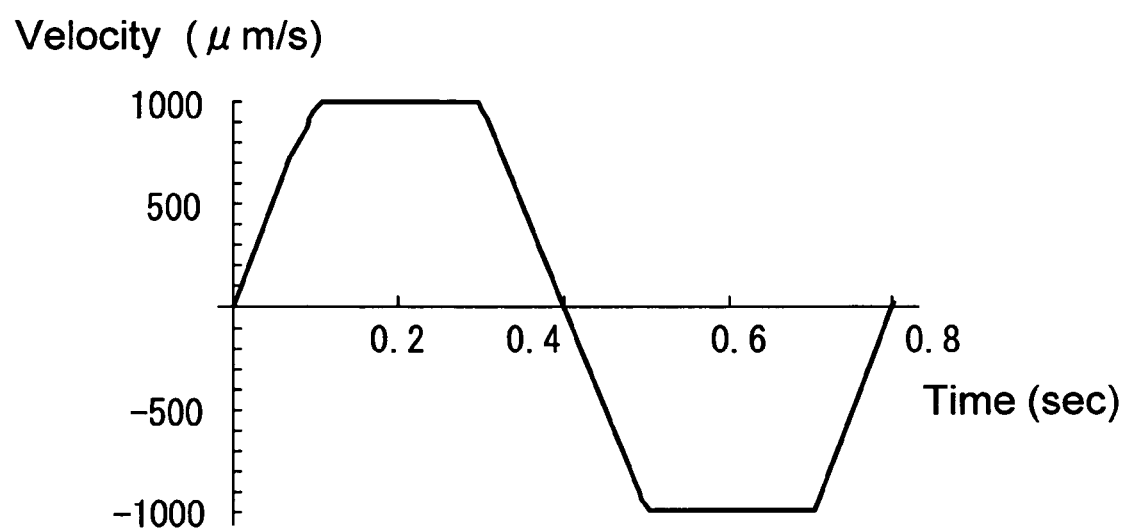
FIG. 14 graphically shows an exemplary velocity pattern.

An exemplary velocity change pattern of the XY stage 105 is shown in FIG. 14. As shown in this graph, XY stage 105 is driven to move with constant acceleration in a one direction, move at a constant velocity, move at a decreasing speed with fixed deceleration, move in the opposite direction with constant acceleration, move at constant velocity, and move at decreasing speed with the fixed deceleration. With this sequence of motions as a one cycle, XY stage 105 repeats this motion pattern having a trapezoidal waveform as a whole.

Figure 15:
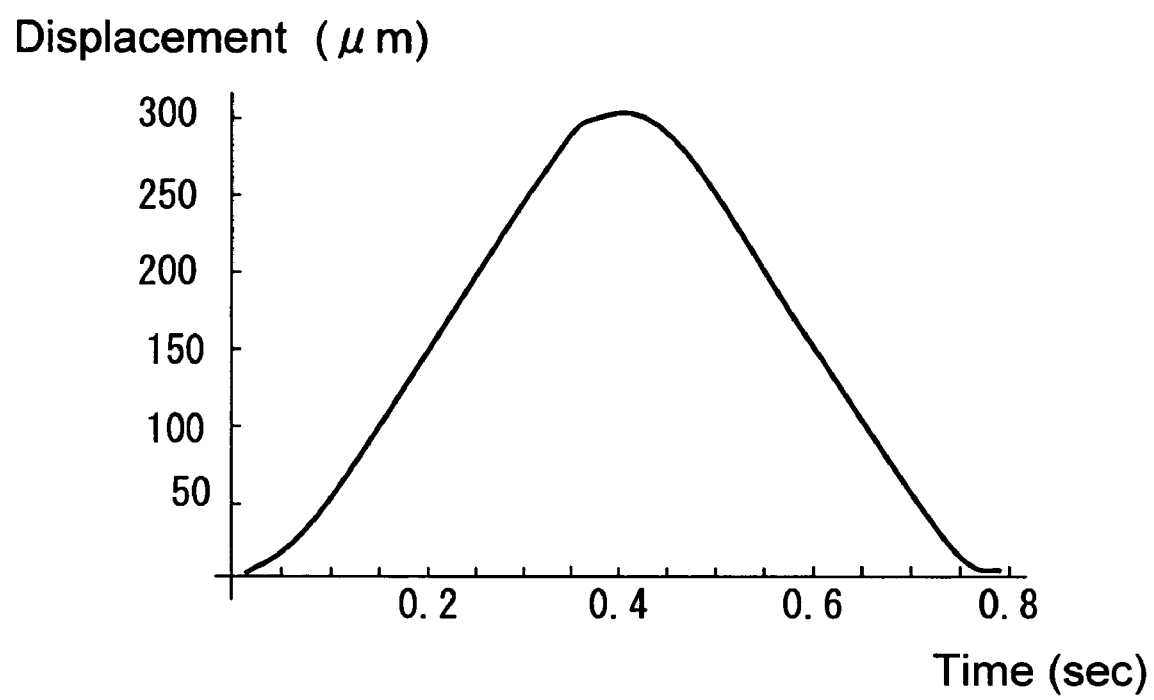
FIG. 15 shows a pattern of displacement with time.

While the XY stage 105 is moving in the trapezoidal velocity change pattern of FIG. 14, its position change or displacement with time is as shown in FIG. 15. In the case of laser-assisted distance measurements, nonlinear error components are contained in a measurement data signal due to the presence of unavoidable optical-path problems. Such nonlinear errors are occurred by unwanted interference between vertical and horizontal waves being mixed in the laser light used. In other words, the beam reflection at the mirror or else in the laser length meter device results in horizontal wave components interfering with vertical waves and vice versa, which leads to occurrence of nonlinear errors. The result of this is generation of measurement data with such nonlinear errors being added to the linear component.

At step S504 of FIG. 13, the above-noted nonlinear error components are removed away. More specifically, remove the nonlinear error components from the measured value obtained at step S502. Usually these nonlinear error components are high-frequency components relative to the "pure" position data component of XY stage 105, so letting the measurement signal to pass through the LPF 122 of FIG. 12 enables attenuation of a frequency region that contains the high-frequency nonlinear error components at a prespecified cutoff frequency from the position component data as has been converted from the measurement value of the laser interferometer 300.

Figure 16A:
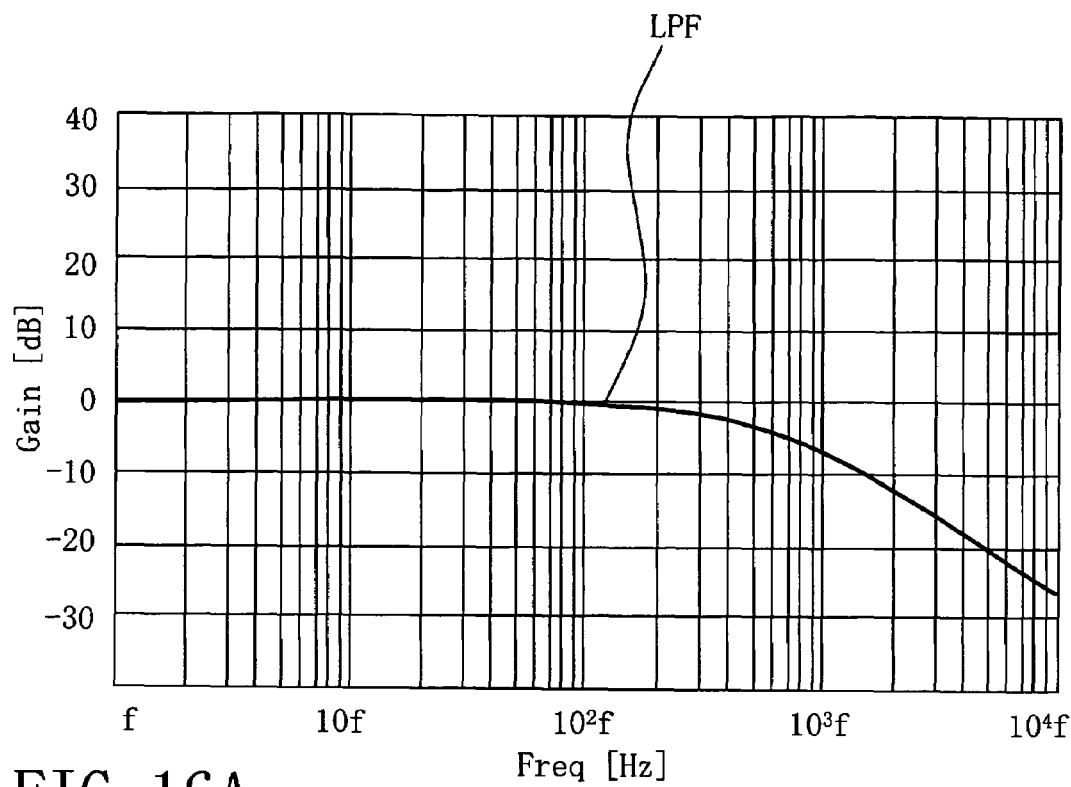
FIG. 16A is a graph showing a curve of gain versus frequency for low-pass filtered position component data.
Figure 16B:
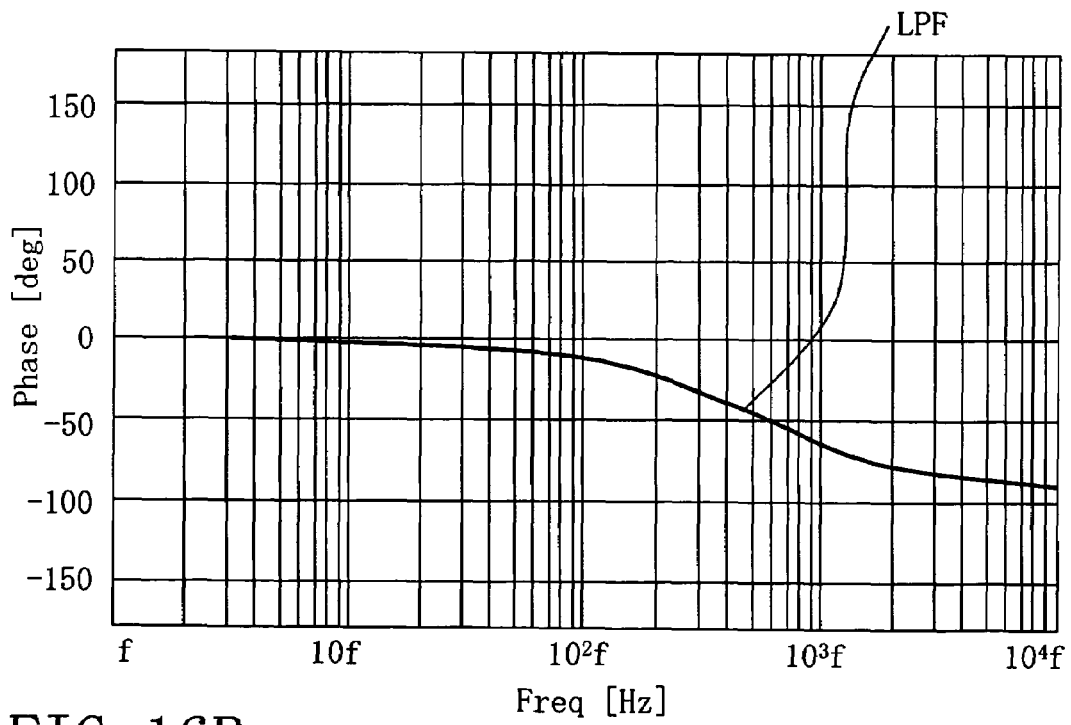
FIG. 16B shows a plot of phase versus frequency of the data.

As shown in FIG. 16A, when letting the output signal of position calculator 109 pass through LPF 122 having the prespecified cutoff frequency, the resulting measured data signal is attenuated in its frequency region that contains the high-frequency nonlinear error components. This makes it possible to remove such nonlinear error components away from the position data as has been converted from the measured value of the laser interferometer 300. However, as shown in FIG. 16B, this lowpass filtering would result in occurrence of a delay in phase of the position data. If this data is directly used to determination of a present position of XY stage 105, then the signal phase delay causes position offsets, which in turn causes a deviation of beam irradiation position to be later described.

Figures 17A, 17B:
FIGS. 17A-17B show transfer function equations of a low-pass filter (LPF) 122 shown in FIG. 12.

The LPF 122 is designed to have its transfer function $G_1(S)$ as represented by Equation shown in FIG. 17A. In this equation, "$f_n$" is the cutoff frequency, $\tau_n$ is the time constant (where, $\tau=1/(2\Pi f)$, and S is the Laplace operator. However, in the event that the measured position data as output from the position calculator 109 is merely guided to pass through the LPF 122 only, a primary differentiation term as expressed by $\tau_1 \cdot S/(1+\tau_1 \cdot S)$ in FIG. 17B, i.e., velocity component term, remains as a residual difference.

Figures 18A, 18B:
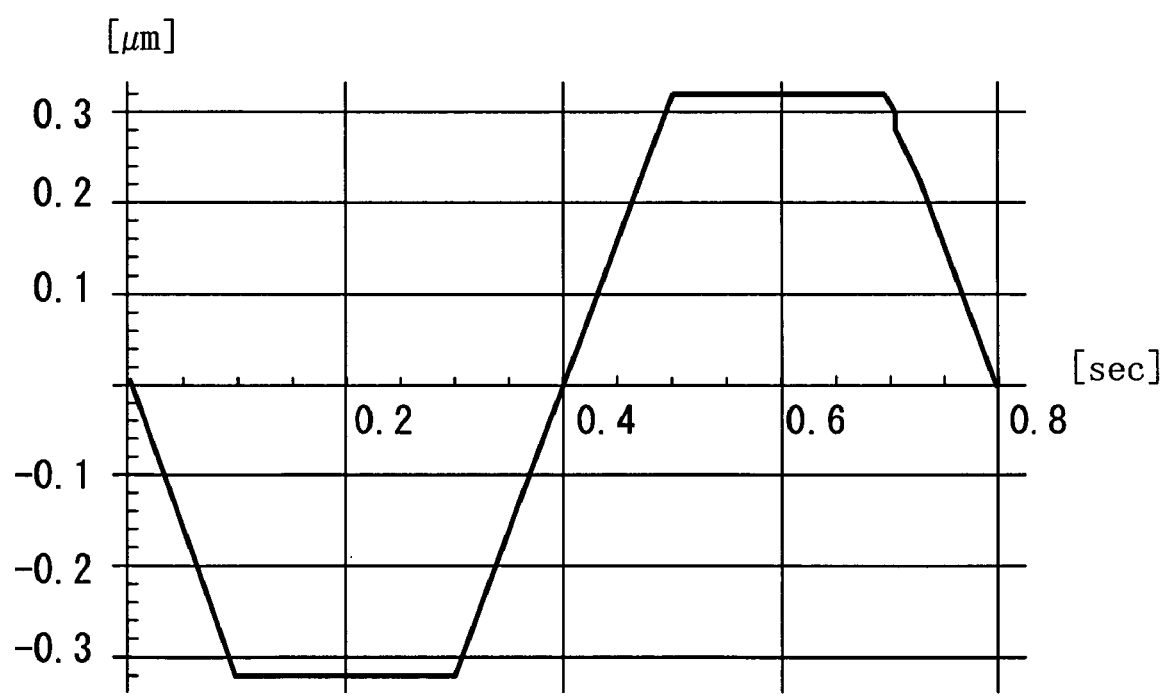
FIGS. 18A-18B show a position offset simulation result when letting the measurement data pass through the LPF only.

In case the LPF 122 has its transfer function as shown in FIG. 18A, merely letting the measurement data signal pass through LPF 122 results in occurrence of velocity-proportional displacements as demonstrated by a simulation result shown in FIG. 18B. This simulation is under the condition that the XY stage 105 is moved in the trapezoidal pattern of FIG. 14.

To correct or amend such velocity-proportional displacements, at step S512 of FIG. 13, let the signal pass through the first pair of series-coupled HPF 124 and LPF 126 in parallel with the LPF 122 shown in FIG. 12. By this filtering, it is possible to attenuate the high-frequency nonlinear error component-containing frequency region from the output position data signal of the position calculator 109 at a predetermined cutoff frequency.

Figure 19A:
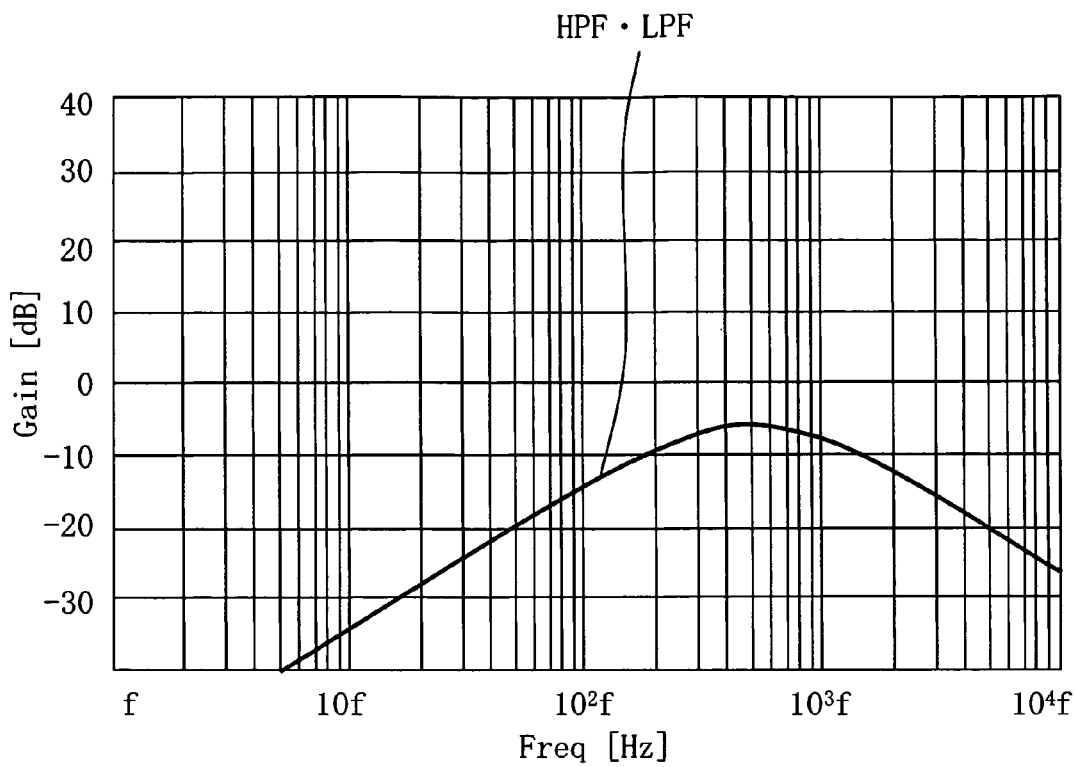
FIG. 19A is a graph showing a plot of gain versus frequency for position measurement data which passed through a first pair of high- and low-pass filters, and FIG. 19B show a plot of phase versus frequency of the data.
Figure 19B:
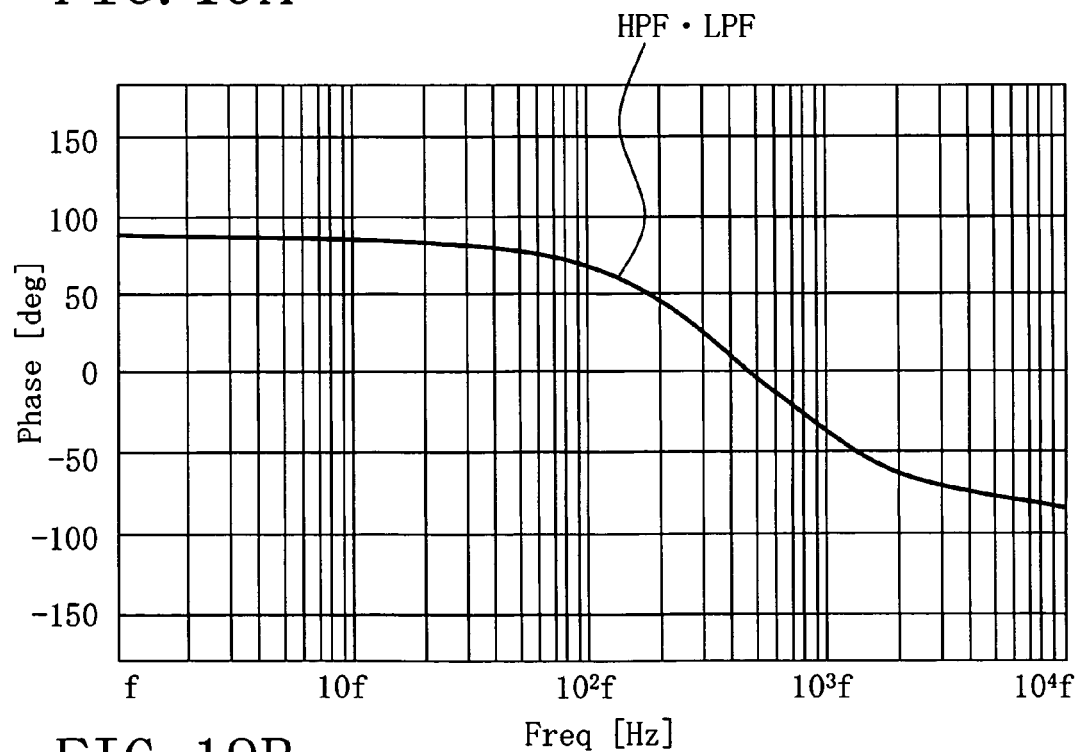

The frequency dependence of the gain of the position data signal which has passed through the first pair of series-coupled HPF 124 and LPF 126 is shown in FIG. 19A. The frequency dependence of the phase of it is plotted in FIG. 19B. As shown in FIG. 19B, the highpass filtering using the HPF 124 permits the position data signal to advance in phase. And, as shown in FIG. 19A, the components other than the frequency region to be attenuated by the "stand-alone" LPF 122 is attenuated prior to the filtering. Further, by the lowpass filtering at LPF 126, the component of the same frequency region as that of the LPF 122-attenuated frequency region is attenuated. Thus, a phase-advanced data signal is formed to have both-side frequency regions that are attenuated at the same cutoff frequency as that of LPF 122.

Figure 20A:
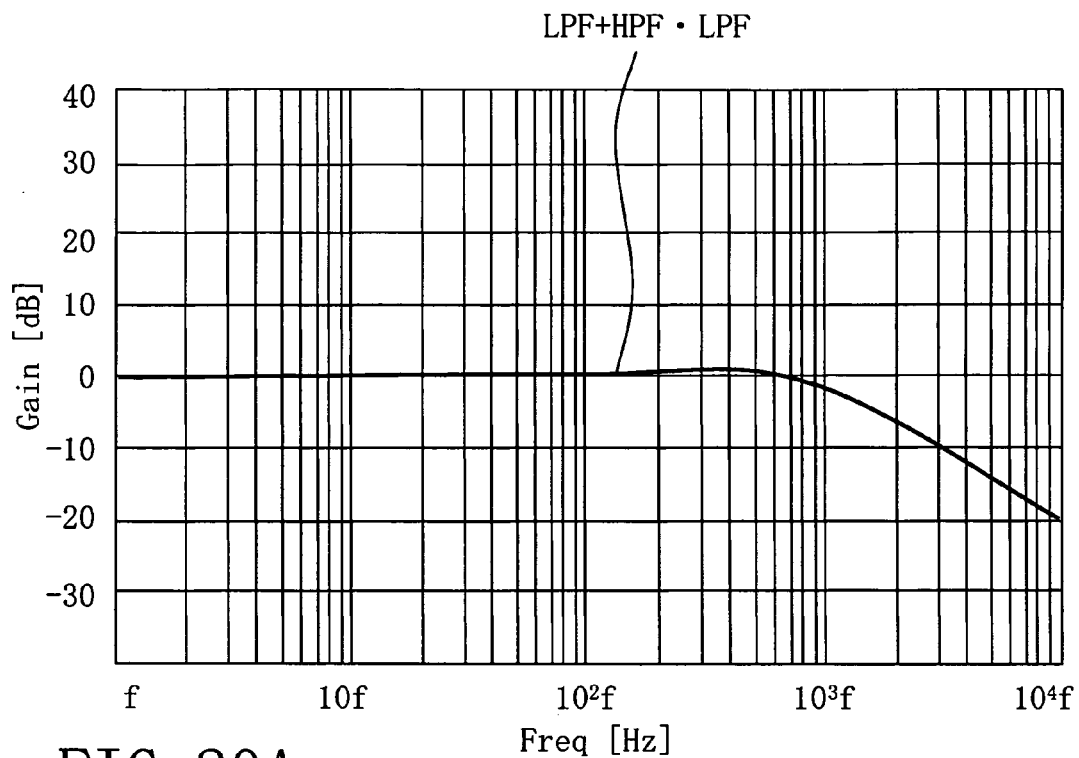
FIG. 20A is a graph showing a plot of gain versus frequency for combined data of the lowpass-filtered position data and the position data which passed through the first pair of high/low-pass filters, and FIG. 20B show a plot of phase vs. frequency of the combined data.
Figure 20B:
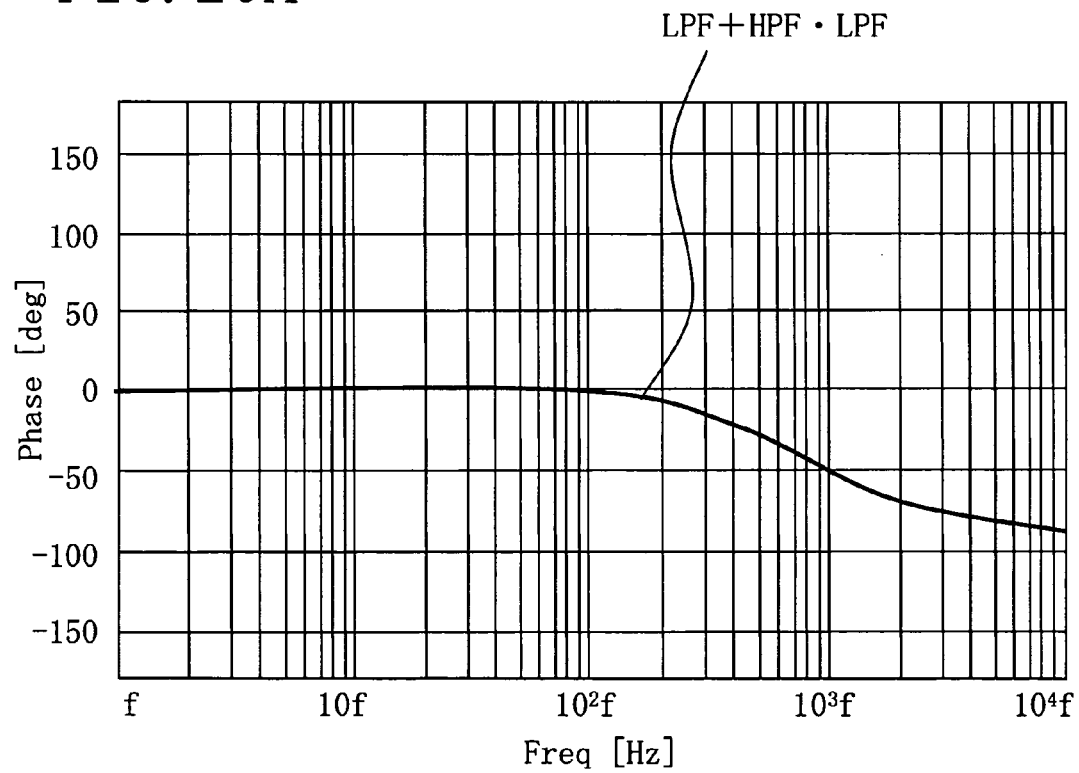

The frequency dependence curves of the gain and phase of the added value signal as output from the adder 128 are shown in FIGS. 20A and 20B, respectively. As shown in FIG. 20B, combining two versions of filtered data signals together makes it possible to correct the phase delay and to shift toward the high frequency side a frequency region in which the phase delay begins. It is also possible to shift a gain attenuation startup position toward high frequency side by certain degree as demonstrated by the graph of FIG. 20A.

To prevent the gain and phase from deviating in the frequency region required, the cutoff frequencies of the LPF 122 and the first pair of series-coupled HPF 124 and LPF 126 are adequately adjusted. This enables removal of nonlinear error components while suppressing unwanted phase offsets. However, there still remains a residual difference which follows.

Transfer function equations of a velocity correctability-added filter are shown in FIGS. 21A-21B. HPF 124 has a transfer function as represented by $\tau_2 \cdot S/(1+\tau_2 \cdot S)$, where $\tau_n$ is the time constant ($\tau=1/2\Pi f$), $f_n$ is the cutoff frequency, and S is the Laplace operator. Similarly LPF 126 has its transfer function given by $1/(1+\tau_3 \cdot S)$. Desirably LPF 122 and HPF 124 and LPF 126 are the same in cutoff frequency, although little deviation from this frequency is permissible in practical applications. In the case of the same cutoff frequency, $\tau_1=\tau_2=\tau_3$. When modifying the transfer function equation shown in FIG. 17A to correct its primary time differentiation term (velocity component term), the transfer function equation of the velocity correctable filter is given as $G_2(S)=\{1/(1+\tau \cdot S)\} \cdot \{1+\tau \cdot S/(1+\tau \cdot S)\}$ as shown in FIG. 21A. However, in the case of merely letting the position measurement data signal pass through the velocity correction filter, a secondary or two-order time differentiation term, i.e., acceleration component term, is left as a residual difference, which is represented by $\tau^2 \cdot S^2/(1+\tau \cdot S)^2$ as shown in FIG. 21B.

Figures 22A, 22B:
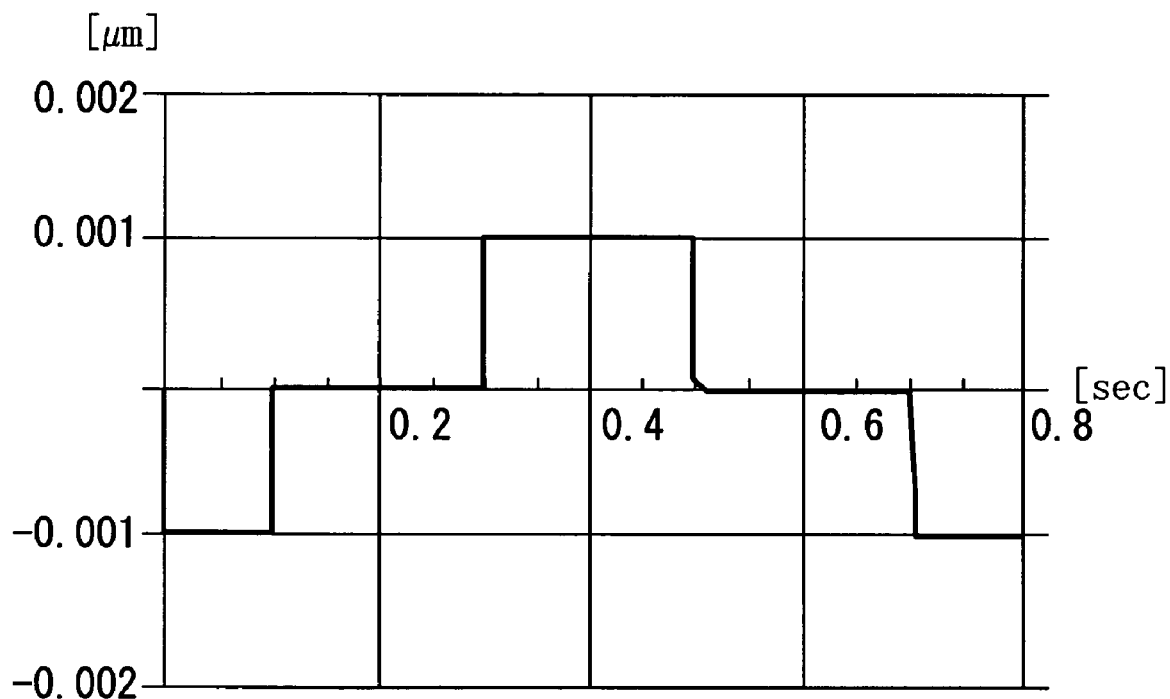
FIGS. 22A-22B show a position offset simulation result when letting the position measurement data pass through the velocity-correctable digital filter.

Displacement simulation was conducted by letting the signal pass through digital filter circuitry with the velocity correctability. In the simulation the LPF 122 and the first paired HPF 124 and LPF 126 were designed to attain the transfer function as given by equation of FIG. 22A. A result of the simulation is shown in FIG. 22B. As shown in this graph, the trapezoidal velocity pattern of XY stage 105 experiences acceleration-proportional position changes or displacements, resulting in "corruption" of the waveform as shown in FIG. 22B.

To correct such acceleration component term, the system procedure goes to step S514 of FIG. 13. At this step, remove nonlinear acceleration error components away from the position measurement data signal. To do this, let the signal pass through the second pair of series-coupled HPF 134 and LPF 136 shown in FIG. 12. Doing so makes it possible to correct the occurrence of an acceleration-proportional position deviation, and attenuate the high-frequency nonlinear error component-containing frequency region from the data signal at the specified cutoff frequency.

Figure 23A:
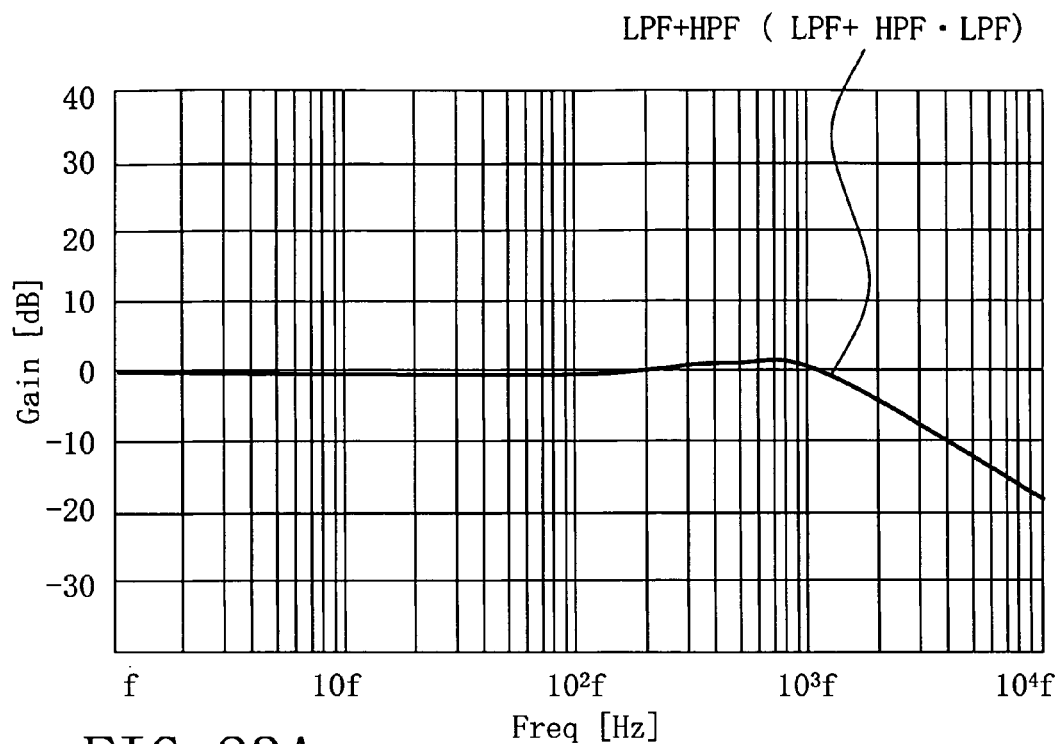
FIG. 23A is a graph showing a plot of gain versus frequency for combined data of the lowpass-filtered position data and the position data which passed through the first pair of high/low-pass filters plus position data which passed through a second pair of high/low-pass filters, and FIG. 23B show a plot of phase vs. frequency of the combined data.
Figure 23B:
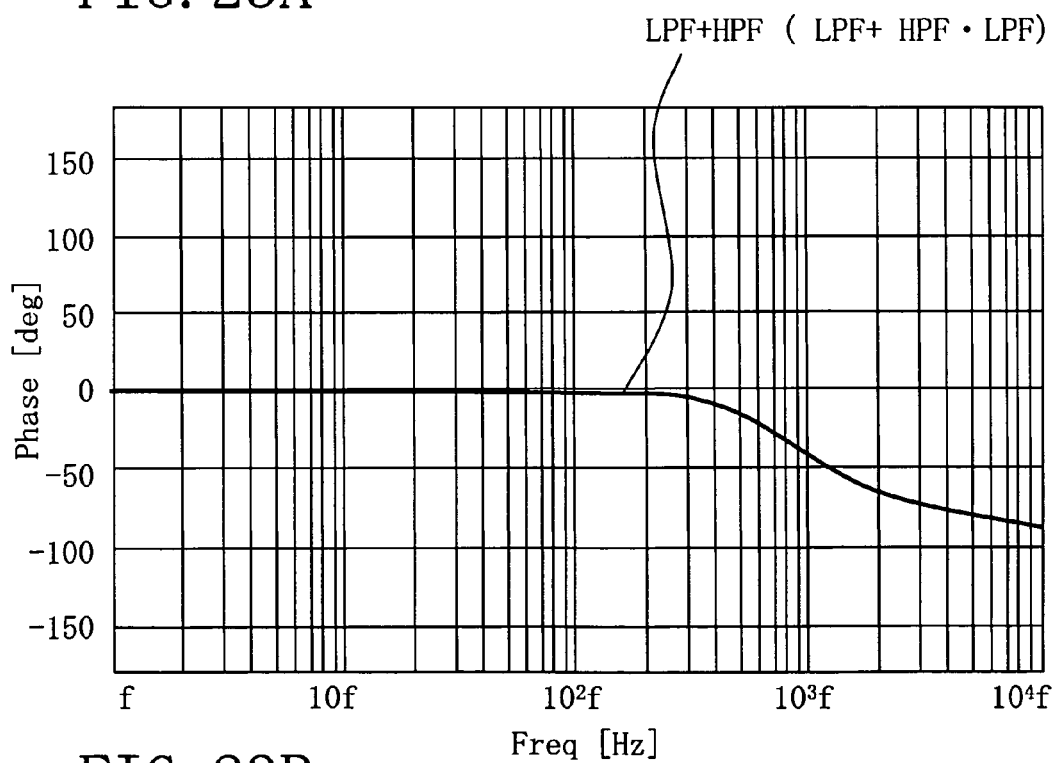

The acceleration-corrected data signal as output from the second pair of HPF 134 and LPF 136 is sent to the adder 128 and then added to and combined together with the output signals of the LPF 122 and the first paired HPF 124 and LPF 126. This triple combined signal has its gain and phase characteristics as shown in FIG. 23A-23B. As well demonstrated by a curve of phase versus frequency shown in FIG. 23B, combining three filtered data signals together makes it possible to correct phase delay and also shift toward the high frequency side the frequency region in which the phase delay beings to occur. In addition, as shown by a gain vs. frequency curve of FIG. 23A, the gain attenuation start point is also shiftable toward the high-frequency side.

By adequately adjusting the cutoff frequency of the LPF 122 and the first pair of series-coupled HPF 124 and LPF 126 and second paired HPF 134 and LPF 136 in such a way as to suppress deviation between the gain and phase in the necessary frequency region, it is possible to remove nonlinear error components away from the position measurement data signal while simultaneously avoiding phase offset risks. However, the resulting signal can yet contain a residual difference of the type which follows.

Transfer function equations of an acceleration correctability-added filter are shown in FIGS. 24A-24B. HPF 134 has a transfer function as represented by $\tau_4 \cdot S/(1+\tau_2 \cdot S)$, where $\tau_n$ is the time constant ($\tau_n = 1/(2\Pi f_n)$), $f_n$ is the cutoff frequency, and S is the Laplace operator. Similarly LPF 136 has its transfer function given by $1/(1+\tau_5 \cdot S)$. Desirably LPF 122 and first paired HPF 124 and LPF 126 and second paired HPF 134 and LPF 136 are the same in cutoff frequency, although little deviation from this frequency is permissible in practical applications. In the case of the same cutoff frequency, $\tau_1 = \tau_2 = \tau_3 = \tau_4 = \tau_5$. When modifying the transfer function equation shown in FIG. 21A to correct its secondary time differentiation term (acceleration component term), the transfer function equation of the acceleration correctable filter is given as $G_3(S) = \{1/(1+\tau \cdot S)\} \cdot [1+\tau \cdot S/(1+\tau \cdot S)\{1+\tau \cdot S/(1+\tau \cdot S)\}]$ as shown in FIG. 24A. However, in the case of letting the position measurement data signal pass through the acceleration correction filter, a three-order or tertiary time differentiation term, i.e., the so-called "varying acceleration" component term, is left as a residual difference, which is represented by $\tau^3 \cdot S^3/(1+\tau \cdot S)^3$ as shown in FIG. 21B.

Figures 25A, 25B:
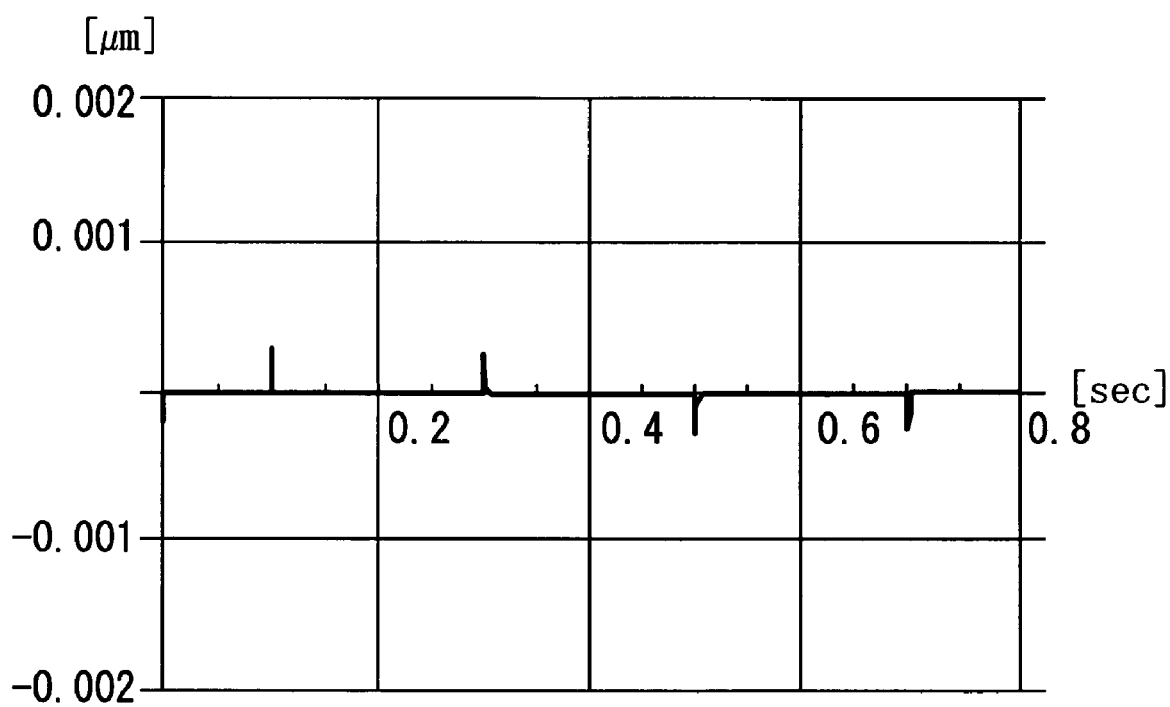
FIGS. 25A-25B show a position offset simulation result when letting the position data pass through the acceleration-correctable digital filter.

Displacement simulation was conducted while causing the signal to pass through digital filter circuitry with the acceleration error component correctability. In the simulation the LPF 122 and the first paired HPF 124 and LPF 126 plus the second paired HPF 134 and LPF 136 were designed to establish the transfer function given by equation of FIG. 25A. A result of the simulation is shown in FIG. 25B. This graph demonstrates that the displacements occurring during the motion with constant acceleration of the XY stage 105 in the trapezoidal velocity pattern shown in FIG. 14 are corrected almost successfully, although certain displacements are still contained therein in the form of spike noises.

At step S510 of FIG. 13, the three separate filtered data signals—i.e., an output signal of LPF 122, an output of the first pair of series-coupled HPF 124 and LPF 126, and an output of the second pair of series-coupled HPF 134 and LPF 136—are combined together by adder 128 to generate a combined data signal, which is then supplied to the pattern write controller 111.

By supplying to the control circuit 111 the resultant XY-stage position measurement data signal with possible velocity/acceleration-proportional displacements being corrected by the double parallel-path digital filter 110a and also with nonlinear error components being removed therefrom, it becomes possible to further increase the accuracy of detection of a present position of the moving XY stage 105. Using this extra-high-accuracy position data enables the controller 111 to increase in processing accuracy accordingly. Then, controller 111 controls the electron optics and deflectors 205 and 208 of the variable-shaped electron beam pattern generator in the barrel 102 so that the electron beam 200 falls onto the workpiece 101 as placed on the continuously moving XY stage 105 in the chamber 103 while at the same time keeping track of a desired position, resulting in highly accurate depiction or "writing" of a prespecified pattern on workpiece 101.

Embodiment 3

A variable-shaped electron beam lithography apparatus in accordance with a further embodiment of the invention is arranged to employ a stage position measurement technique which offers enhanced supportability to an XY stage that is driven to move while varying the acceleration as well as the XY stage moving with fixed acceleration as in the embodiment stated supra. A position measurement method capable of removing nonlinear error components occurring while the stage is in motion with varying acceleration will be described below. A variable-shaped electron beam writing apparatus in accordance with embodiment 3 is similar to that shown in FIG. 1, except an internal configuration of the filter unit 110.

Figure 26:
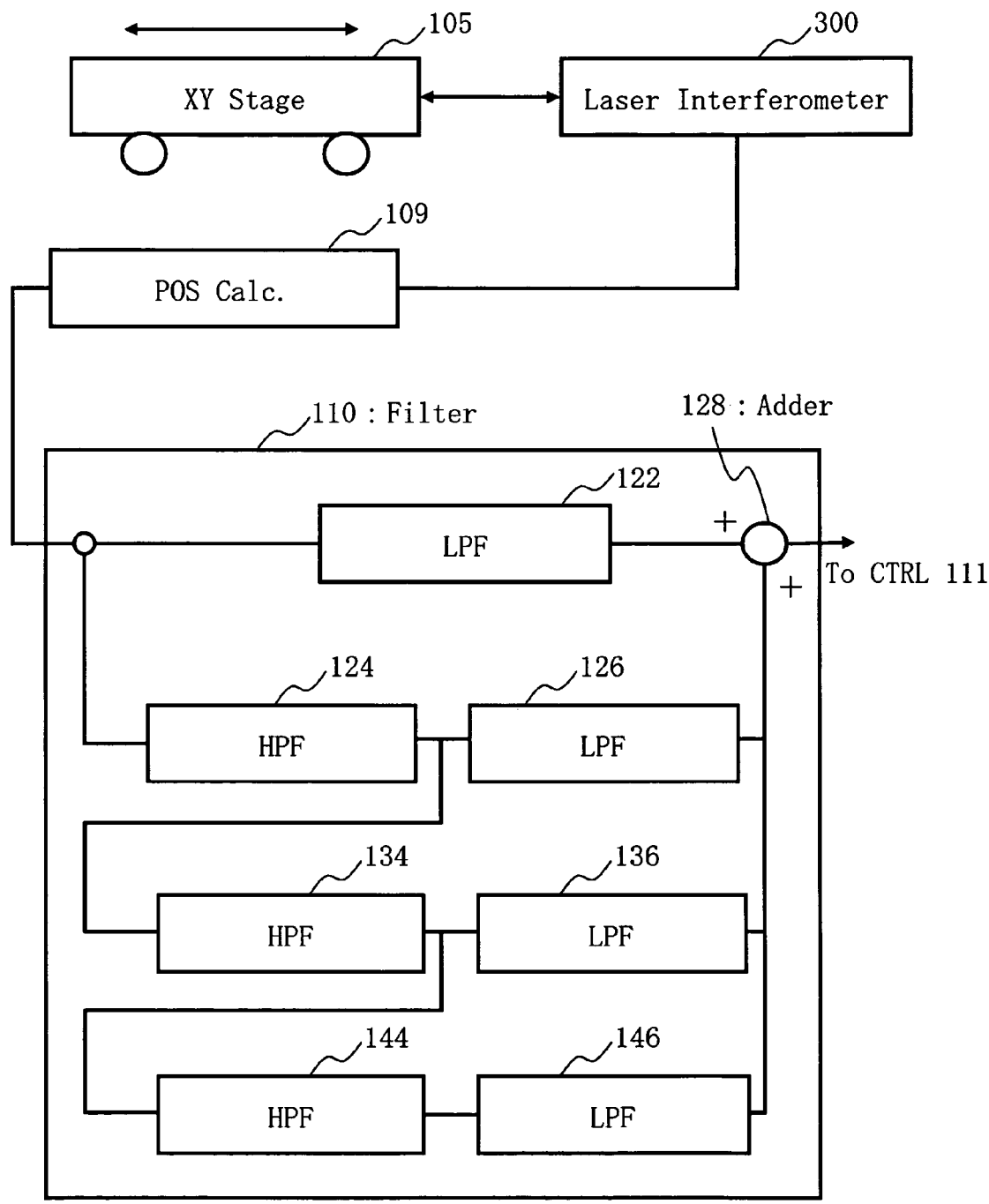
FIG. 26 shows an internal configuration of a filter unit in accordance with an embodiment 3.

FIG. 26 shows an internal configuration of a filter unit 110 in accordance with an embodiment 3. Upon receipt of an output signal of the laser interferometer 300 which indicates a present position of the moving XY stage 105, the position calculator 109 converts it to a position component data signal indicating the measured position data. This data is supplied to the LPF 122 and the first pair of HPF 124 and LPF 126 and the second pair of HPF 134 and LPF 136 in a similar way to the embodiment 2. A highpass-filtered signal as output from the HPF 134 is also sent to the "third" pair of series-coupled HPF 144 and LPF 146. The third pair of HPF 144 and LPF 146 is connected in parallel with the LPF 136 of the "second" pair, and in series to the HPF 134 of the "second" pair. These HPF 144 and LPF 146 are the same in cutoff frequency as the LPF 122. Four separate filtered signals—i.e., an output signal of LPF 122, an output of first paired HPF 124 and LPF 126, an output of second paired HPF 134 and LPF 136, and an output of third paired HPF 144 and LPF 146—are added and combined together by adder 128 to generate an added data signal, which is supplied to the pattern write controller 111.

Figure 27A:
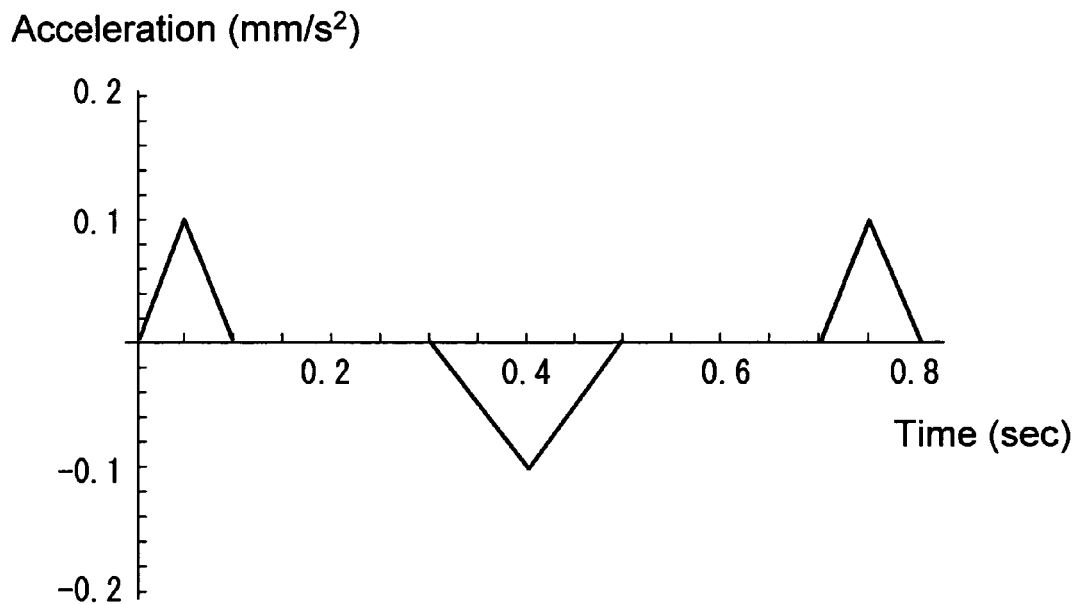
FIGS. 27A-27B show exemplary acceleration and velocity patterns, respectively.
Figure 27B:
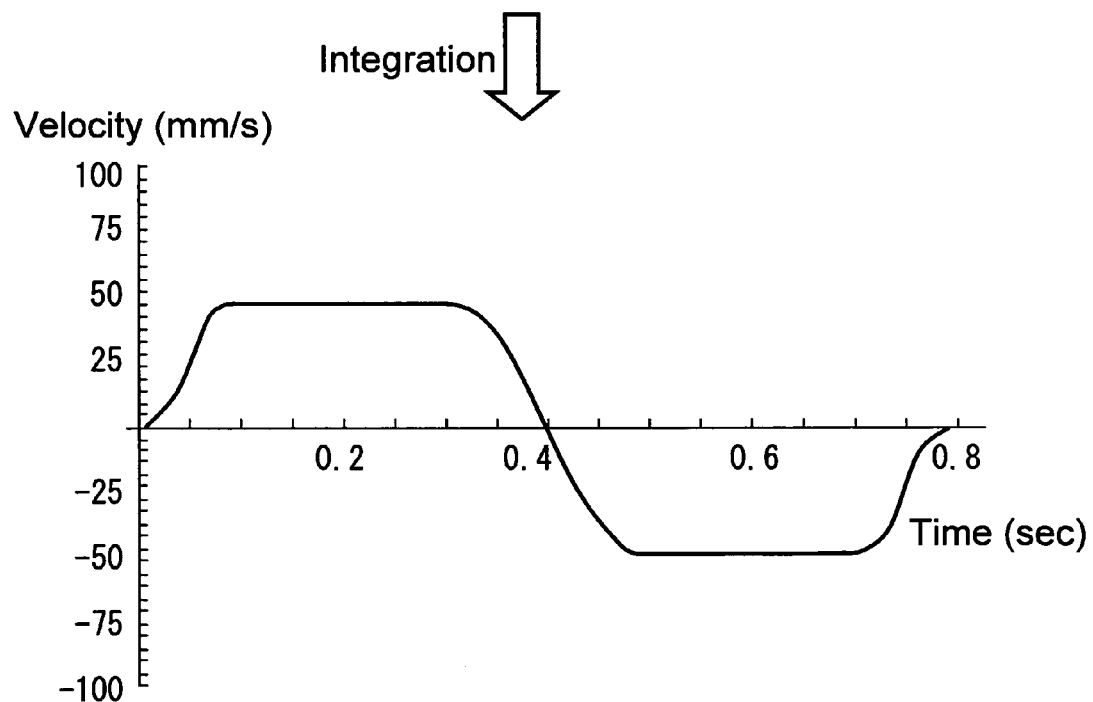

An exemplary pattern of varying acceleration with time is shown in FIG. 27A. FIG. 27B shows a pattern of velocity obtained by applying time-integration processing to the acceleration. In this example, the XY stage 105 is driven to move at constantly variably increasing speed—i.e., with varying acceleration at constant rate—in a direction and then decelerate with constantly variably decreasing speed—i.e., with varying deceleration at fixed rate—and thereafter move at constant velocity as shown in FIG. 27B. Then, XY stage 105 accelerates with constantly varying acceleration in the opposite direction and decelerates with constantly varying deceleration and thereafter moves at a constant speed.

Figures 28A, 28B:
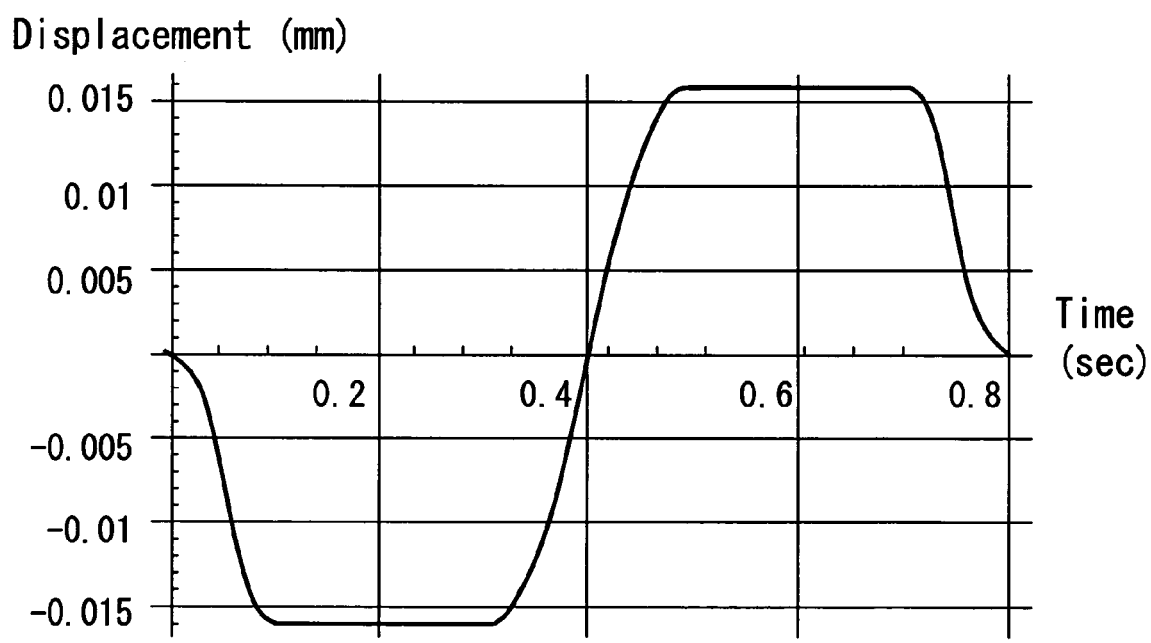
FIGS. 28A-28B show a position offset simulation result in the case of passing through a low-pass filter only.

In case the LPF 122 of FIG. 26 has its transfer function represented by an equation shown in FIG. 28A, when letting a position measurement data signal pass through LPF 122 only, the filtered signal experiences occurrence of a velocity-proportional displacement as shown by a simulation result of FIG. 28B while the XY stage 105 is being driven in the acceleration change pattern shown in FIGS. 27A-27B.

Figures 29A, 29B:
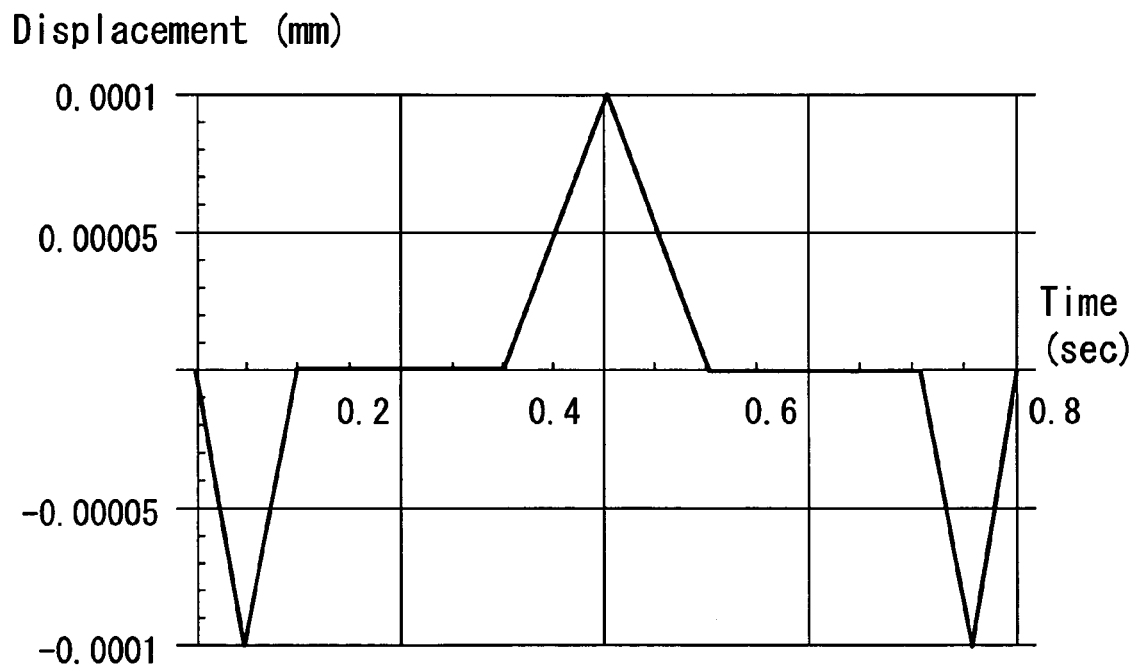
FIGS. 29A-29B show a position offset simulation result in the case of passing through a velocity-correctable digital filter.

In case the velocity correction function-added filter consisting of the LPF 122 and the first pair of HPF 124 and LPF 126 which has its transfer function represented by an equation shown in FIG. 29A, when letting the position measurement signal pass through the filter, the resulting signal experiences occurrence of an acceleration-proportional displacement as shown by a simulation result of FIG. 29B while the XY stage 105 is being driven in the acceleration change pattern shown in FIGS. 27A-27B.

Figures 30A, 30B:
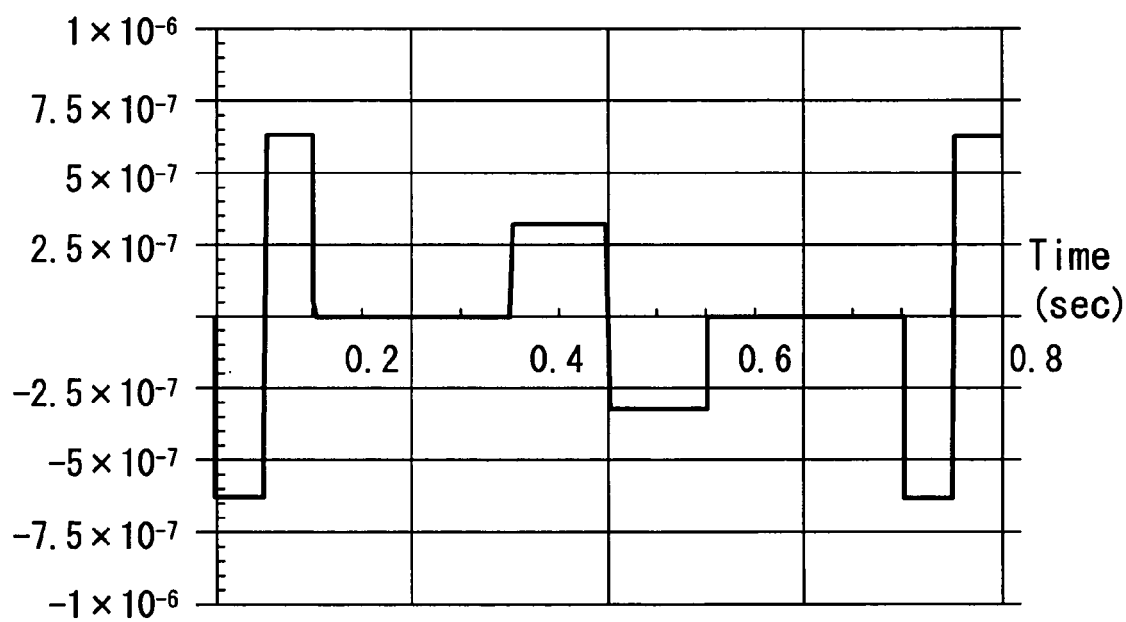
FIGS. 30A-30B show a position offset simulation result in the case of passing through an acceleration-correctable digital filter.

In case the acceleration error correction function-added filter consisting of the LPF 122 and the first pair of HPF 124 and LPF 126 plus the second pair of HPF 134 and LPF 136 which has its transfer function given by an equation shown in FIG. 30A, when letting the position measurement signal pass through this filter, the resultant signal exhibits "survival" of a varying acceleration-proportional displacement as shown by a simulation result of FIG. 30B while the XY stage 105 is moved in the acceleration change pattern shown in FIGS. 27A-27B.

Figure 31A:
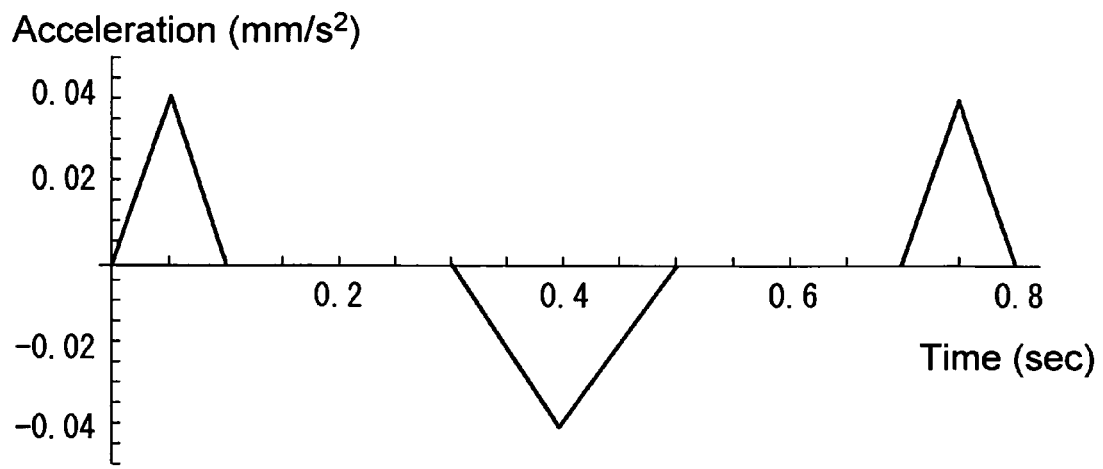
FIGS. 31A-31B show other exemplary acceleration and velocity patterns respectively.
Figure 31B:
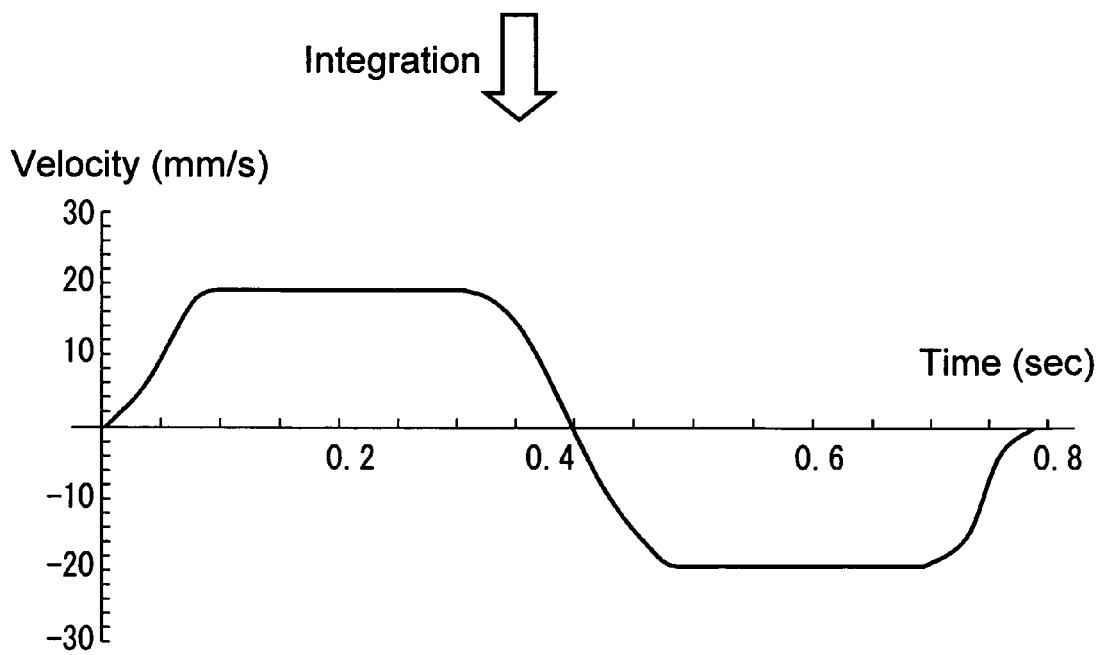

Another pattern of varying acceleration with time is shown in FIG. 31A. A pattern of velocity obtained by applying time-integration processing to the acceleration is in FIG. 31B. In this example, the XY stage 105 is driven to move in an acceleration change pattern which is similar to that shown in FIGS. 27A-27B except that its acceleration and deceleration peak values and constant velocity values are different therefrom.

Figures 32A, 32B:
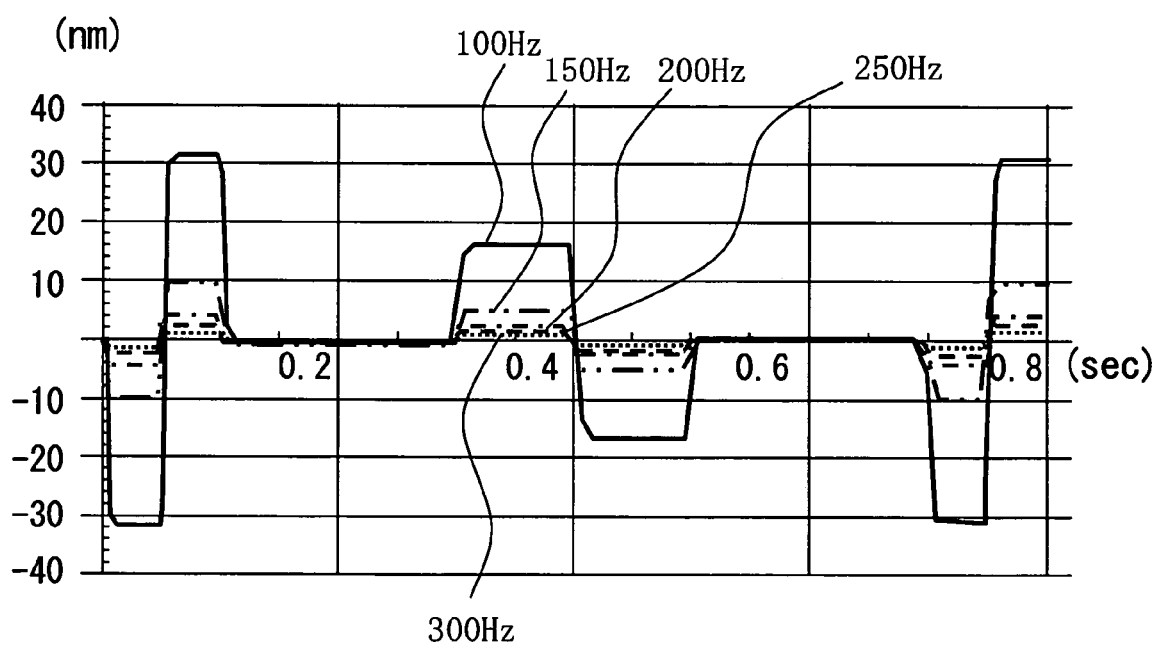
FIGS. 32A-32B show a position offset simulation result in the case of passing through acceleration-correctable digital filter circuitry.

In case the acceleration correction function-added filter consisting of the LPF 122 and the first pair of HPF 124 and LPF 126 plus the second pair of HPF 134 and LPF 136 which has its transfer function given by an equation shown in FIG. 32A, when letting the position measurement data signal pass through this filter, the resulting signal is such that a varying acceleration-proportional displacement is left therein as shown by a simulation result of FIG. 32B while the XY stage 105 is moved in the variable acceleration change pattern shown in FIGS. 31A-32B. Note however that adequate value setting of the cutoff frequency makes it possible to adjust the magnitude of the constantly varying acceleration components so that it becomes smaller. For example, letting the cutoff frequency increase from 100 Hz up to 300 Hz causes the magnitude of constantly varying acceleration components to become smaller accordingly. Even in this case, the variable acceleration component term is not zeroed and still remains therein as discussed in conjunction with FIG. 24B.

To correct the varying acceleration-proportional displacement term, let the position measurement signal pass through the third pair of series-coupled HPF 144 and LPF 146 shown in FIG. 26. By doing so, it is possible to attenuate or remove the high-frequency nonlinear error component-containing frequency region from the position data signal of the position calculator 109, which signal was obtained by conversion thereby from the measured value as sent from the laser interferometer 300.

Figure 33A:
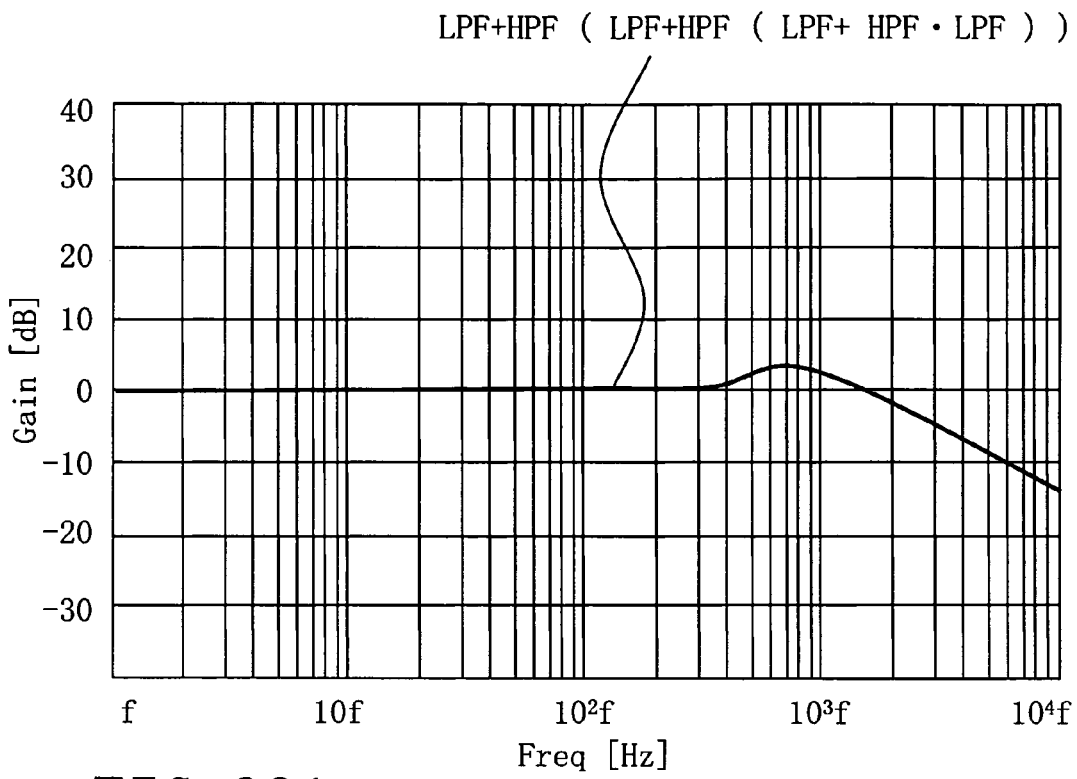
FIG. 33A is a graph showing a plot of gain versus frequency for combined data of lowpass-filtered position measurement data and position data which passed through first to third pairs of high/low-pass filters, and FIG. 33B show a plot of phase vs. frequency of the combined data.
Figure 33B:
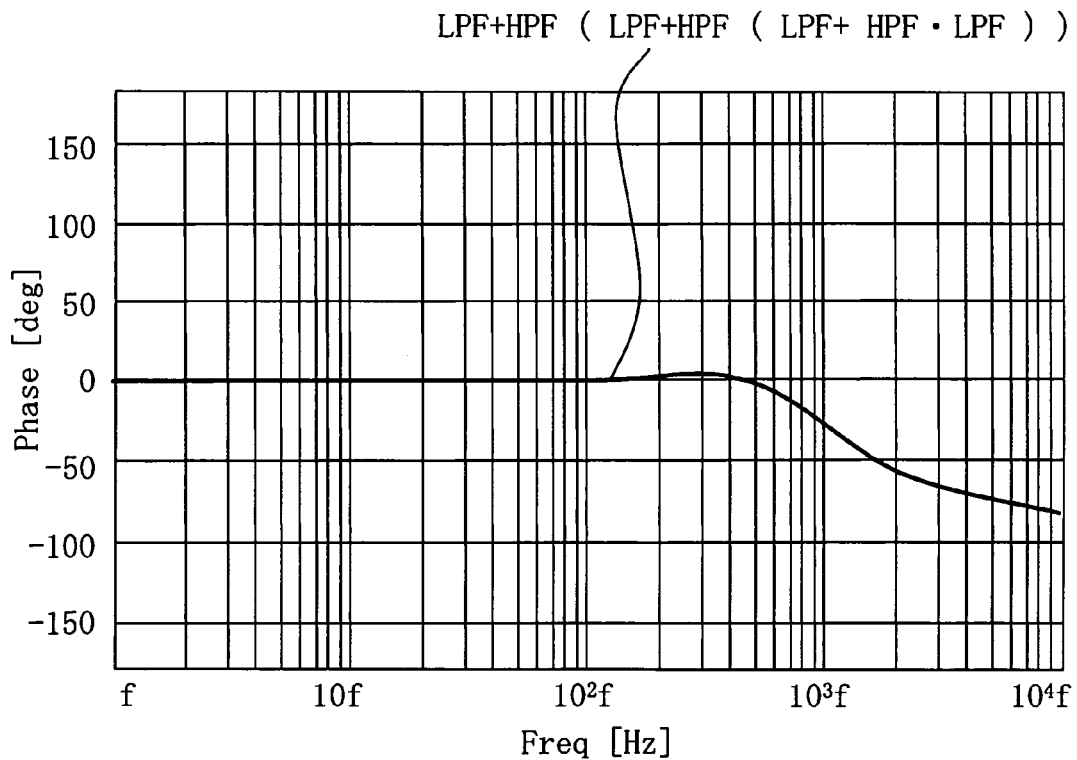

An output data signal of the adder 128 of FIG. 26 which indicates an added value of the four separate data signals that are filtered by the LPF 122 and first to third HPF/LPF pairs has its gain and phase, the frequency dependence of the former is shown in FIG. 33A and the latter of which is in FIG. 33B. As well demonstrated by FIG. 33B, combining together the four filtered data signals results in correction of phase delays while enabling the phase delay-beginning frequency region to shift toward the high frequency side. In addition, as shown in FIG. 33A, it is possible to further slide by a little degree the gain attenuation start point toward the high frequency side.

By adjusting the cutoff frequency of the LPF 122 and the first to third HPF/LPF pairs 124-126, 134-136 and 144-146 in such a way as to prevent deviation of the gain and phase in the necessary frequency region, it is possible to remove nonlinear error components while simultaneously suppressing phase offsets.

Figures 34A, 34B:
FIGS. 34A-34B show transfer function equations of variable acceleration-correctable digital filter circuitry.

Transfer function equations of a varying velocity correctability-added filter are shown in FIGS. 34A-34B. HPF 144 has a transfer function represented by $\tau_6 \cdot S/(1+\tau_2 \cdot S)$, where $\tau_n$ is the time constant ($\tau_n = 1/(2\Pi f_n)$), $f_n$ is the cutoff frequency, and S is the Laplace operator. Similarly LPF 146 has its transfer function given by $1/(1+\tau_7 \cdot S)$. Desirably LPFs 122 and 126-146 and HPFs 124-144 are the same in cutoff frequency, although little deviation from this frequency is permissible in practical applications. In the case of the same cutoff frequency, $\tau_1 = \tau_2 = \tau_3 = \tau_4 = \tau_5 = \tau_6 = \tau_7$. When modifying the transfer function equation shown in FIG. 24A to correct its tertiary time differentiation term (varying acceleration component term), the transfer function equation of the velocity correctable filter is given as $G_4(S) = \{1/(1+\tau S)\} \cdot [1+\tau S/(1+\tau S) [1+\tau S/(1+\tau S)\{1+\tau S/(1+\tau S)\}]]$ as shown in FIG. 34A. However, in the case of merely letting the position measurement data signal pass through the varying acceleration correction filter, a quartic or four-order time differentiation term, i.e., high-order acceleration component term, is left as a residual difference, which is represented by $\tau^4 \cdot S^4/(1+\tau \cdot S)^4$ as shown in FIG. 34B.

Figures 35A, 35B:
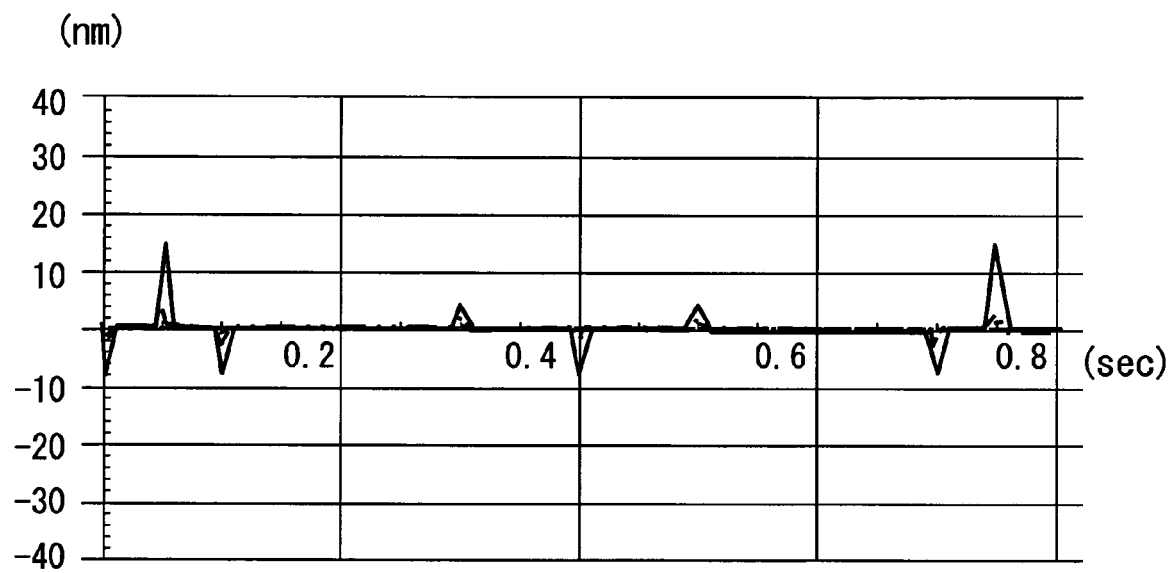
FIGS. 35A-35B show a position offset simulation result in the case of passing through the varying acceleration-correctable digital filter.

Displacement simulation was conducted by letting the signal pass through digital filter circuitry with the high-order acceleration correctability. In the simulation the LPF 122 and the first to third HPF/LPF pairs 124-126, 134-136 and 144-446 were designed to attain the transfer function as given by equation of FIG. 35A. A result of the simulation is shown in FIG. 35B. As shown, the high-order acceleration change pattern of XY stage 105 shown in FIG. 31 exhibits successful removal of up to the constantly varying acceleration-proportional displacements, although irregularly varying acceleration-proportional displacements are left therein.

By supplying to the control circuit 111 the resultant XY-stage position measurement data signal with possible velocity/acceleration/variable acceleration-proportional displacements being corrected by the triple parallel-path digital filter 110b and also with nonlinear error components being removed therefrom, it becomes possible to further increase the accuracy of detection of a present position of the moving XY stage 105. Using this ultrahigh-accuracy position data enables the controller 111 to increase in processing accuracy accordingly. Then, controller 111 controls the electron optics and deflectors 205 and 208 of the variable-shaped electron beam pattern generator in the barrel 102 so that the electron beam 200 falls onto the workpiece 101 as placed on the continuously moving XY stage 105 in the chamber 103 while at the same time keeping track of a desired position, resulting in highly accurate depiction or "writing" of a prespecified pattern on workpiece 101.

Figure 36A:
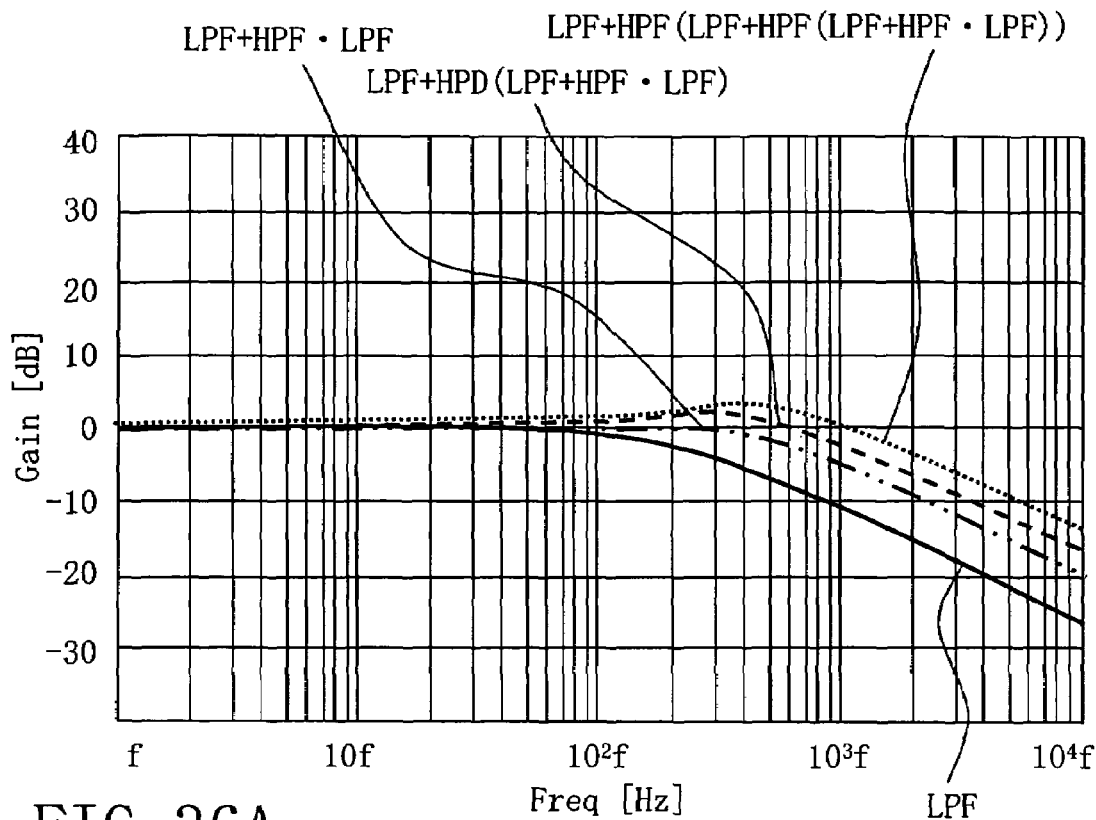
FIG. 36A is a graph showing curves of gain versus frequency for position measurement data when letting it pass through the LPF-alone filter, velocity-correctable filter, acceleration-correctable filter and varying acceleration-correctable filter, respectively, and FIG. 36B show a plot of phase vs. frequency of the data.
Figure 36B:
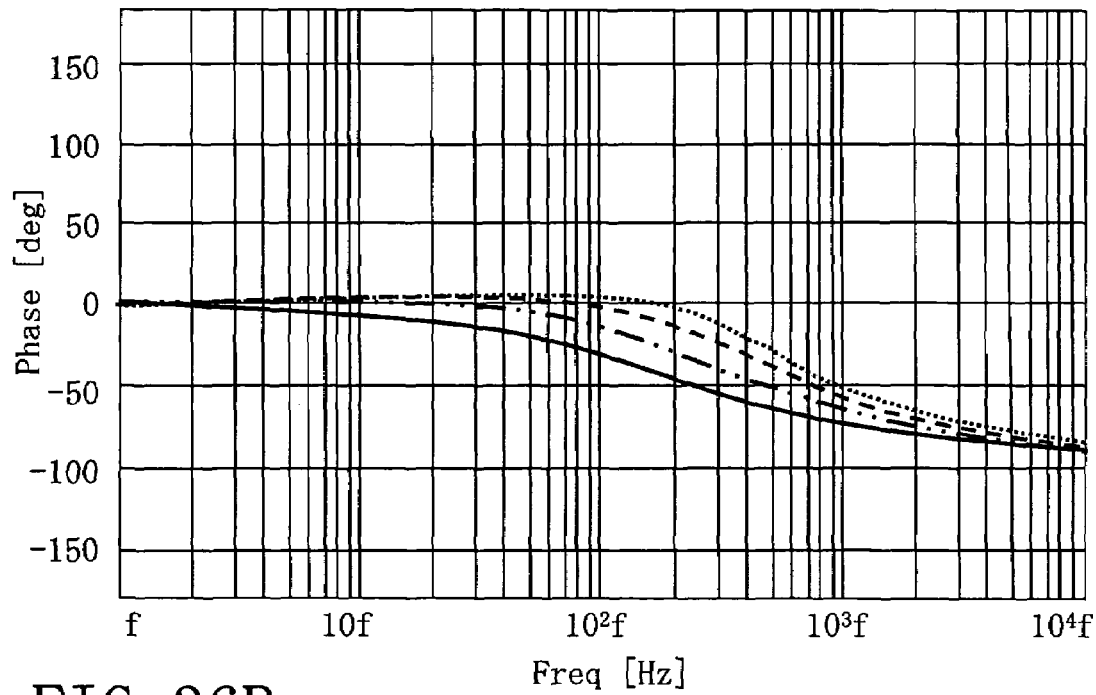

See FIGS. 36A and 36B, which show the frequency dependence of the gain and phase of a position measurement data signal as output from the triple parallel-path filter unit 110b of FIG. 26, that is, an added data signal obtained by combining together the data signal passed through the LPF 122, the signal passed through the second pair of series-coupled HPF 124 and LPF 126 with velocity correctability, the signal passed through the third paired HPF 134 and LPF 136 with acceleration correctability, the signal passed through the third paired HPF 144 and LPF 146 with variable acceleration correctability. As shown in FIG. 36B, high-order noise correction is achievable. More specifically, it is possible to further shift the phase delay-beginning frequency region so that the variable acceleration correction is achieved. This makes it possible to suppress displacement to thereby permit achievement of the irregularly variable acceleration correction.

The triple parallel-path filter unit 110b may be modifiable to include further pairs of series-coupled HPF and LPF each of which pairs is coupled in parallel with an LPF in its previous stage. If this is the case, it is possible to remove extra-high-order nonlinear error components away from the position measurement data signal.

Usually, the slower the stage moves, the lower the frequency of nonlinear error components; the faster the stage moves, the higher the frequency of nonlinear error components. Accordingly, position detection of mask/wafer stages being moved at higher speeds, higher acceleration and higher varied acceleration is such that occurrable nonlinear error components tend to increase in frequency. Thus, use of the multiple parallel-path combined filtering technique of the invention offers an ability to enhance the frequency region attenuation, thereby to achieve maximally enhanced removability of such high-frequency nonlinear error components.

As apparent from the foregoing, the position measurement apparatus in accordance with the second embodiment of the invention includes the movable stage structure, the measurement unit using a laser to measure a moved position of the stage. the position measurement apparatus also includes the first filter operative to attenuate a component of a certain frequency region from a measured value of the measurement unit, the second filter connected in parallel with the first filter for attenuating a component other than the certain frequency region from the measured value of the measurement unit, the third filter connected in series to the second filter for attenuating the component of the certain frequency region from the measured value of the measurement unit, the fourth filter connected in series to the second filter and in parallel with the third filter for attenuating a component other than the certain frequency component region from the measured value of the measurement unit, and the fifth filter coupled in series to the fourth filter for attenuating the certain frequency component from the measured value of the measurement unit. the position measurement apparatus also includes the synthetic unit for combining together the measured value of the measurement unit which passed through the first filter and the measured value which passed through the second and third filters and also the measured value which passed through the second, fourth and fifth filters to thereby output a combined signal indicative of the added value of the three separate filtered data signals.

With such an arrangement, the measurement data signal as filtered by the first filter is combined together with other versions of the data signal which are filtered by the second and third filters while setting their cutoff frequency region to the nonlinear error occurring region, thereby making it possible to remove nonlinear error components and also to correct displacements of velocity-proportional components. Furthermore, in the case of the XY stage being moved at varying speeds, let the data signal as filtered by the second filter be combined together with the data signal filtered by the fourth and fifth filters, it is possible to correct acceleration-proportional displacements.

Also importantly, the first and third filters are lowpass filters. The second filter is a highpass filter. The fourth filter is either one of highpass filter and lowpass filter. The fifth filter is the other of them.

As stated previously, the nonlinear error components are usually higher in frequency than the XY-stage motion. Thus, using the lowpass filter as the first filter makes it possible to remove such high-frequency nonlinear error components. Additionally, let the measurement data signal pass through the second filter (e.g., HPF) and third filter (LPF), thereby removing residual velocity-proportional displacements occurring due to the filtering characteristics, which are incapable of being removed by mere pass-through of the first filter (LPF). Further, let the data signal pass through the fourth filter (i.e., one of LPF and HPF) and the fifth filter (the other of LPF and HPF), thereby to remove acceleration-proportional displacements, which remain even after having passed through the second and third filters during the velocity-varying stage motion.

The position measurement apparatus in accordance with the embodiment 3 of the invention further includes the sixth filter connected in series to the fourth filter and in parallel with the fifth filter for attenuating a component other than the certain frequency region from the measured value of the measurement unit, and the seventh filter coupled in series to the sixth filter for attenuating the component of the certain frequency region from the measured value of the measurement unit. And the synthetic unit operates to further combine together the measured value of the measurement unit which passed through the second, fourth and sixth filters to thereby output a combined value.

In case the XY stage is driven to move at varying speed as in the third embodiment, let the measurement signal pass through the second, fourth, sixth and seventh filters for addition to the above-noted combined data signal. This makes it possible to remove residual displacements of variable acceleration-proportional components in addition to the velocity- and acceleration-proportional components.

The pattern drawing or "writing" apparatus employing the position measurement technique in accordance with the second embodiment is interpreted as an apparatus including a movable stage supporting thereon a workpiece, a measurement unit operative to measure a moved position of the stage by use of a laser, a lowpass filter for causing a measured value of the measurement unit to pass therethrough while being set at a prespecified cutoff frequency, a first pair of a lowpass filter and a highpass filter for causing the measured value of the measurement unit to pass therethrough while letting a cutoff frequency of the first pair be set equal to the prespecified cutoff frequency, a second pair of lowpass and highpass filters each having a cutoff frequency being set equal to the predefined cutoff frequency for causing the measured value which has passed through the highpass filter of the first pair, and a pattern generator unit responsive to receipt of a combined value of the measured value of the measurement unit which passed through the lowpass filter and the measured value of the measurement unit which passed through the first pair of the lowpass and highpass filters and also the measured value of the measurement unit which passed through the second pair of lowpass and highpass filters, for writing a pattern on the workpiece at a desired position thereof.

With such an arrangement, it is possible to correct both velocity-proportional and acceleration-proportional displacements to thereby remove high-order nonlinear error components. This enables the stage position measurement data signal to increase in accuracy or fidelity. Supplying such high-accuracy/high-fidelity detection signal to the pattern writing unit makes it possible for this unit to write a specified pattern on the target workpiece at a desired position(s).

The position measurement technique for use in each apparatus of the above-stated embodiments may be regarded as a method which includes the steps of measuring a moved position of a stage by using a laser, removing a nonlinear error component from a measured value by use of a lowpass filter being set to a predefined cutoff frequency, correcting occurrence of a velocity-proportional position deviation against the measured value by using a first pair of lowpass and highpass filters each having its cutoff frequency identical to the predefined cutoff frequency, and correcting occurrence of an acceleration-proportional position deviation against the measured value by use of a second pair of lowpass and highpass filters each having a cutoff frequency identical to the predefined cutoff frequency.

Owing to the enhanced correctability of velocity/acceleration-proportional displacements and also variable acceleration-proportional displacements, it is possible to measure and detect a present position of the moving stage with increased precision and accuracy. This in turn enables achievement of high-accuracy pattern writing on a target workpiece as mounted on the stage.

An example of the triple combined filter unit 110b is a digital filter, which is installable as a software program in an FPGA chip. In other words, the filter unit is configurable in the form of a computer-executable software program or a combination of hardware and software configurations or a combination with firmware. The program is prestored in storage media, such as removable or fixed magnetic disks, magnetic tapes, floppy diskettes (FDs), read-only memories (ROMs) or any equivalents thereto.

Figure 37A:
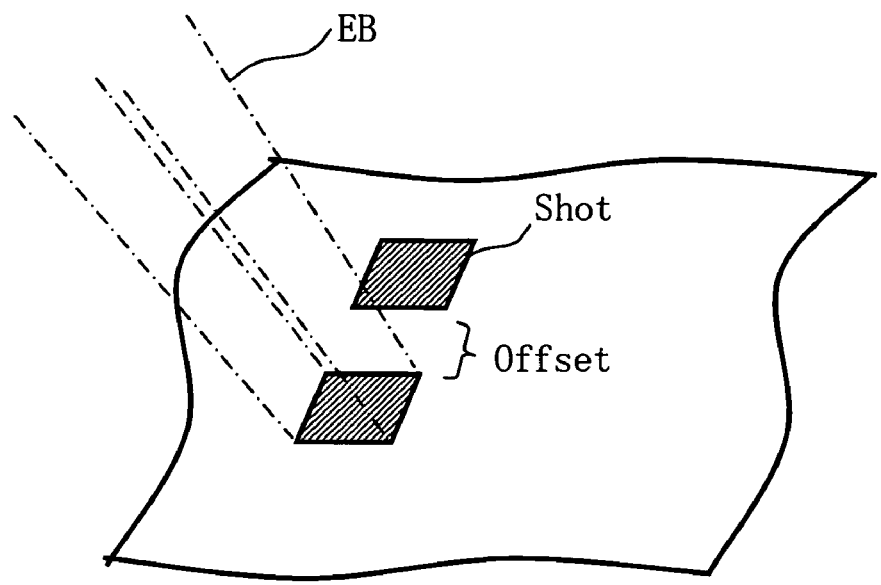
FIGS. 37A-37B are comparative diagrams each showing a perspective view of part of a workpiece surface on which a pattern write beam is shot.
Figure 37B:
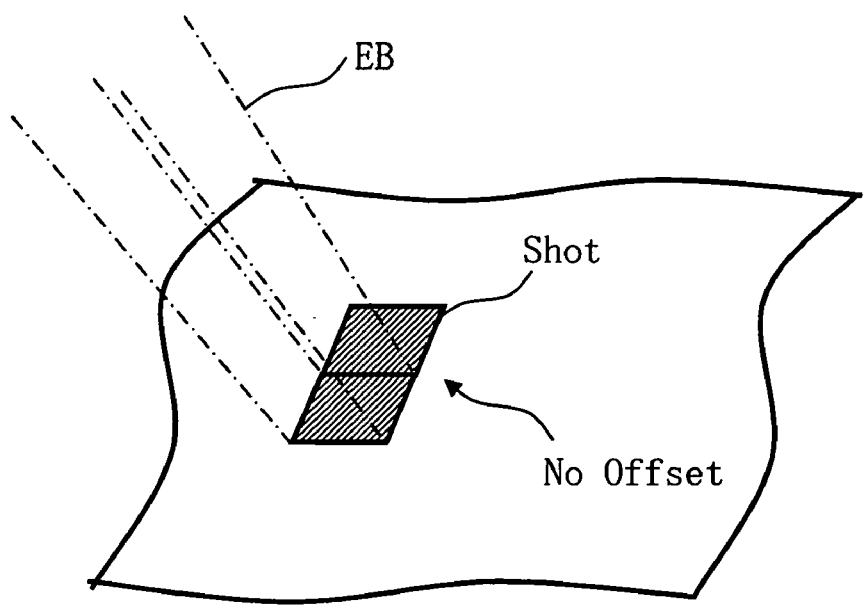
Figure 38:
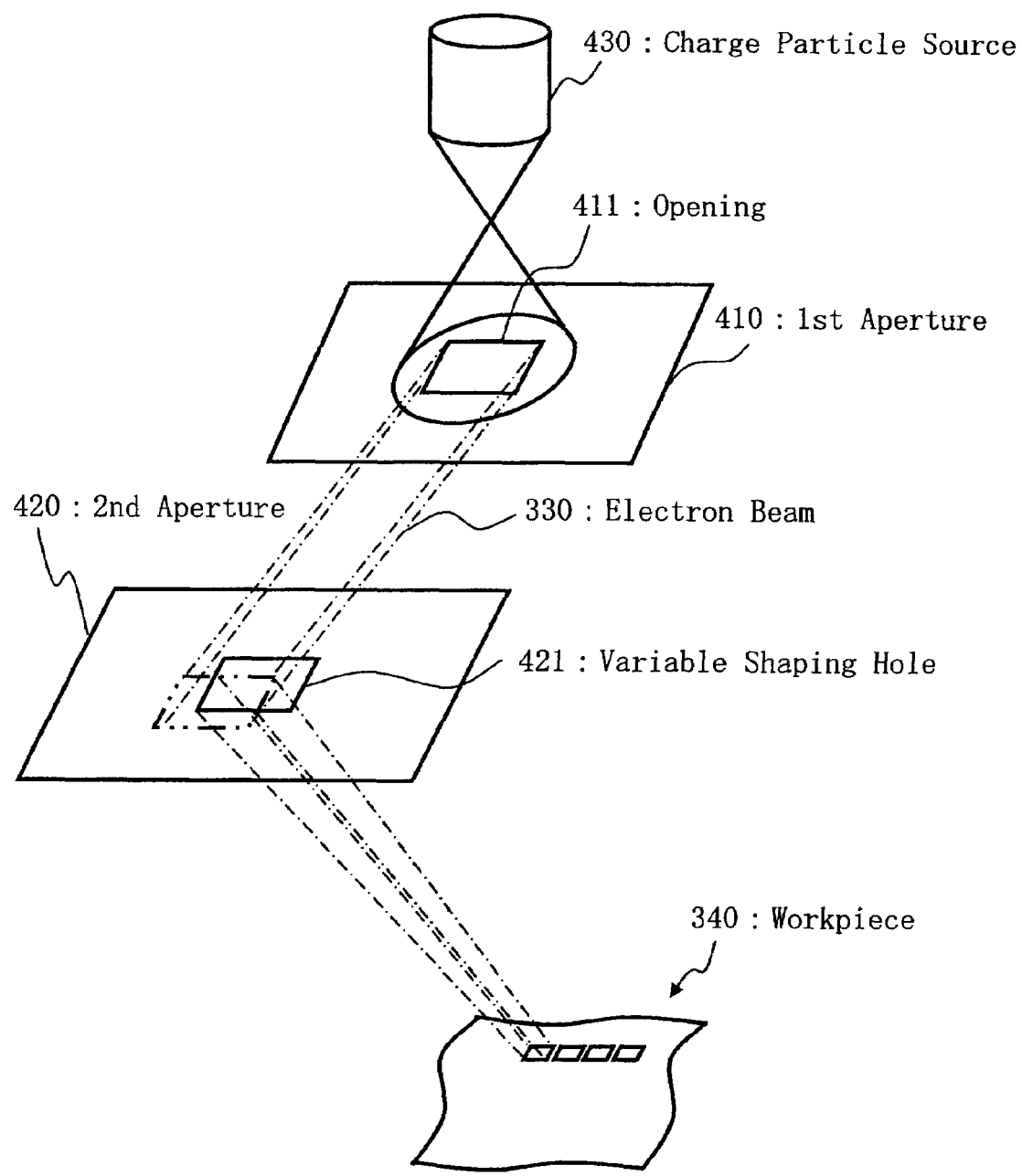
FIG. 38 is a pictorial representation of the behavior of an electron beam in prior known variable-shaped electron beam photolithography apparatus.

When an electron beam is irradiated or "shot" onto a workpiece for pattern depiction thereon while using stage position measurement techniques without the use of the combined filtering technique embodying the invention, the beam spot on the workpiece can be offset from its initially target hit position as shown in FIG. 37A. This unwanted displacement takes place due to deficiency or lack of the accuracy of a stage position measurement signal occurring due to the mixture of residual high-frequency nonlinear error components in the signal. This displacement sometimes results in occurrence of electrical short-circuiting in the circuitry formed on the workpiece. On the contrary, as shown in FIG. 37B, using the combined filtering technique of the invention enables the beam to accurately hit its target position on the workpiece. This makes it possible to write the intended circuitry pattern with increased accuracy without accompanying beam shot deviation risks.

Another advantage of the combined filtering techniques in respective embodiments lies in an ability to reduce digital noises. This can be said because letting the stage position measurement signal pass through the combined filter unit 110, 110a or 110b makes it possible to eliminate or at least greatly reduce fluctuations otherwise occurring due to least significant bits (LSB) of the position data. Such digital noise reduction enables further improvement of stage position measurement accuracy.

While the invention has been described with reference to specific embodiments, the description is illustrative of the invention and is not to be construed as limiting the invention. The combined filtering technology incorporating the principles of the invention may be applied to systems other than the lithography/exposure apparatus, which have a continuously or discontinuously driven stage structure. In this case also, similar effects and advantages are obtainable.

Additionally in the combined filter unit 110 shown in FIG. 3, the output data signal of the series-coupled HPF 124 and LPF 126 may be directly supplied to the pattern write controller 111 of FIG. 1, without being added to the output signal of LPF 122. In this case also, the intended velocity-proportional displacement may be corrected to a degree permissible for most practical applications.

Although the illustrative embodiments are arranged to employ an electron beam for depiction of a pattern on target workpiece, such beam may be a charged particle ray or beam, such as ion beam or else. Additionally the principles of the invention are applicable not only to the variable-shaped electron beam lithographic apparatus discussed above but also to ordinary scanning electron beam lithography apparatus using a beam of "fixed" shape.

Although those system components and control schemes which are deemed less relevant to the principles of the invention are not specifically described herein, these may be reduced to practice by using appropriate ones on a case-by-case basis. For example, the EB lithography apparatus 100 may employ several controllers which are implementable by adequately chosen hardware or software arrangements.

Other position measurement methods and apparatus and pattern forming systems using the same, which incorporate the principles of the invention and which are design-modifiable by those skilled in the art, are included within the coverage of the invention.

Additional advantages and modifications will readily occur to those skilled in the art. The invention in its broader aspects is not limited to the specific details and illustrative embodiments shown and described herein. Various modifications may be made without departing from the spirit and scope of the general inventive concept as defined by the appended claims and equivalents thereof.

What is claimed is:

1. A position measurement apparatus comprising:
   a movable stage structure;
   a measurement unit using a laser to measure a moved position of the stage and to output a corresponding measured value;
   a first filter configured to attenuate a first component of a certain frequency region of the measured value outputted by said measurement unit;
   a second filter connected in parallel with said first filter configured to attenuate a second component other than the certain frequency region of the measured value outputted by said measurement unit;
   a third filter connected in series to said second filter with the series connection of said second and third filters connected in parallel with the first filter, configured to attenuate the first component of said certain frequency region of the measured value outputted by said measurement unit; and
   a processing unit configured to combine an output of said first filter and an output of the series connection of the second and third filters and to thereby output a first combined value,
   wherein transfer function of the first filter is given by $1/(1+\tau_1 \cdot S)$ using a time constant $\tau_1$ and a Laplace operator S, transfer function of the second filter is given by $\tau_2 \cdot S/(1+\tau \cdot S)$ using a time constant $\tau_2$ and the Laplace operator S, and transfer function of the third filter is given by $1/(1+\tau_3 \cdot S)$ using a time constant $\tau_3$ and the Laplace operator S.

2. The apparatus according to claim 1, wherein said first filter is a low-pass filter and wherein said second filter is a high-pass filter and said third filter is a low-pass filter.

3. The apparatus according to claim 1, wherein said stage is configured to be driven to move at a constant speed.

4. The apparatus according to claim 1, further comprising:
a fourth filter connected in series to said second filter and in parallel with said third filter configured to attenuate the second component of the measured value outputted by said measurement unit;
a fifth filter coupled in series to said fourth filter with the series connection of said fourth and fifth filters connected in parallel with the third filter, configured to attenuate the first component of the measured value outputted by said measurement unit; and
said processing unit configured to further combine an output of the series connection of fourth and fifth filters with the first combined value and to thereby output a second combined value.

5. The apparatus according to claim 4, wherein the first and third filters are low-pass filters, said second filter is a high-pass filter, said fourth filter is a high-pass filter, and said fifth filter is a low-pass filter.

6. The apparatus according to claim 4, wherein said stage is configured to be driven to move at a varying speed with constant acceleration.

7. The apparatus according to claim 4, further comprising:
a sixth filter connected in series to said fourth filter and in parallel with said fifth filter configured to attenuate the second component of the measured value outputted by said measurement unit;
a seventh filter coupled in series to said sixth filter with the series connection of said sixth and seventh filters connected in parallel with the fifth filter, configured to attenuate the first component of the measured value outputted by said measurement unit; and
said processing unit further combining an output of the series connection of sixth and seventh filters and the second combined value and to thereby output a third combined value.

8. The apparatus according to claim 7, wherein said stage is configured to be driven to move with variable acceleration.

9. A pattern forming apparatus comprising:
a movable stage supporting thereon a workpiece;
a measurement unit configured to measure a moved position of said stage by use of a laser and to output a corresponding measured value;
a low-pass filter for causing the measured value outputted by said measurement unit to pass therethrough while being set at a prespecified cut-off frequency;
a first matched pair comprising a low-pass and a high-pass filter, each having a cut-off frequency being set equal to the prespecified cut-off frequency, for causing the measured value outputted by said measurement unit to pass therethrough; and
a pattern writing unit responsive to receipt of a first combined value of an output of said low-pass filter and an output of said first matched pair comprising the low-pass and the high-pass filter, for writing a pattern on the workpiece at a desired position thereof,
wherein transfer function of the low-pass filter is given by $1/(1+\tau_1 \cdot S)$ using a time constant $\tau_1$ and a Laplace operator S, transfer function of the high-pass filter of the first matched pair is given by $\tau_2 \cdot S/(1+\tau_2 \cdot S)$ using a time constant $\tau_2$ and the Laplace operator S, and transfer function of the low-pass filter of the first matched pair is given by $1/(1+\tau_3 \cdot S)$ using a time constant $\tau_3$ and the Laplace operator S.

10. The apparatus according to claim 9, wherein said pattern writing unit is configured to irradiate a charged particle beam onto said workpiece while deflecting the beam based on said combined value.

11. The apparatus according to claim 9, wherein said stage is configured to be driven to move at a constant speed.

12. The apparatus according to claim 9, further comprising:
a second matched pair comprising a low-pass and a high-pass filter each having a cutoff frequency being set equal to said predefined cut-off frequency, for causing the measured value which has passed through the high-pass filter of said first matched pair; and
said pattern writing unit being responsive to receipt of a second combined value of the first combined value and an output of the second matched pair comprising the low-pass and the high-pass filter, for writing a pattern on said workpiece at a desired position.

13. The apparatus according to claim 12, wherein said stage is configured to driven to move at varying velocity with constant acceleration.

14. A position measurement method comprising:
measuring a moved position of a stage by using a laser;
removing a nonlinear error component from a measured value by use of a low-pass filter being set to a predefined cutoff frequency; and
correcting, by using a first matched pair comprising a low-pass and a high-pass filter each having a cutoff frequency being set equal to said predefined cutoff frequency, a phase delay occurred in said measured value due to the use of said low-pass filter upon removal of the nonlinear error component,
wherein transfer function of the low-pass filter is given by $1/(1+\tau_1 \cdot S)$ using a time constant $\tau_1$ and a Laplace operator S, transfer function of the high-pass filter of the first matched pair is given by $\tau_2 \cdot S/(1+\tau_2 \cdot S)$ using a time constant $\tau_2$ and the Laplace operator S, and transfer function of the low-pass filter of the first matched pair is given by $1/(1+\tau_3 \cdot S)$ using a time constant $\tau_3$ and the Laplace operator S.

15. The method according to claim 14, wherein said measuring includes measuring a moved position of said stage when said stage is in motion with fixed velocity.

16. A position measurement method comprising:
measuring a moved position of a stage by using a laser;
removing a nonlinear error component from a measured value by use of a low-pass filter being set to a predefined cutoff frequency; and
correcting occurrence of a velocity-proportional position deviation against said measured value by using a first matched pair comprising a low-pass and a high-pass filter each having a cutoff frequency identical to said predefined cutoff frequency,
wherein transfer function of the low-pass filter is given by $1/(1+\tau_1 \cdot S)$ using a time constant $\tau_1$ and a Laplace operator S, transfer function of the high-pass filter of the first matched pair is given by $\tau_2 \cdot S/(1+\tau_2 \cdot S)$ using a time constant $E_2$ and the Laplace operator S, and transfer function of the low-pass filter of the first matched pair is given by $1/(1+\tau_3 \cdot S)$ using a time constant t3 and the Laplace operator S.

17. The method according to claim 16, further comprising:
correcting occurrence of an acceleration-proportional position deviation against said measured value by use of a second matched pair comprising a low-pass and a high-pass filter each having a cutoff frequency identical to said predefined cutoff frequency.

18. A writing method comprising:

measuring a moved position of a stage by using a laser;

removing a nonlinear error component from a measured value by use of a low-pass filter being set to a predetermined cutoff frequency; and correcting, by using a first matched pair comprising a low-pass and a high-pass filter each having a cutoff frequency identical to said predetermined cutoff frequency, occurrence of a velocity-proportional position variation with respect to said measured value; and writing a pattern on said workpiece at a desired position in response to receipt of a first combined value of an output of said low-pass filter and an output of said first matched pair comprising the low-pass and the high-pass filter, wherein transfer function of the low-pass filter is given by $1/(1+\tau_1 \cdot S)$ using a time constant $\tau_1$ and a Laplace operator S, transfer function of the high-pass filter of the first matched pair is given by $\tau_2 \cdot S/(1+\tau_2 \cdot S)$ using a time constant $\tau_2$ and the Laplace operator S, and transfer function of the low-pass filter of the first matched pair is given by $1/(1+\tau_3 \cdot S)$ using a time constant $\tau_3$ and the Laplace operator S.

19. The method according to claim 18, further comprising:

correcting, by using a second matched pair comprising a low-pass and a high-pass filter each having a cutoff frequency identical to said predetermined cutoff frequency, occurrence of an acceleration-proportional position variation with respect to said measured value; and writing a pattern on said workpiece at a desired position in response to receipt of a second combined value of the first combined value and an output of said second matched pair comprising the low-pass and the high-pass filter.

* * * * *